(12) United States Patent
Kim

(10) Patent No.: US 9,362,461 B2
(45) Date of Patent: Jun. 7, 2016

(54) LIGHT EMITTING DEVICE AND LIGHTING SYSTEM HAVING THE SAME

(71) Applicant: Gam Gon Kim, Seoul (KR)

(72) Inventor: Gam Gon Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/938,469

(22) Filed: Jul. 10, 2013

(65) Prior Publication Data

US 2014/0054629 A1    Feb. 27, 2014

(30) Foreign Application Priority Data

Aug. 23, 2012  (KR) .................. 10-2012-0092594

(51) Int. Cl.
| | | |
|---|---|---|
| H01L 33/48 | (2010.01) | |
| H01L 25/075 | (2006.01) | |
| H01L 33/62 | (2010.01) | |
| H01L 27/15 | (2006.01) | |

(52) U.S. Cl.
CPC ............ *H01L 33/48* (2013.01); *H01L 25/0753* (2013.01); *H01L 27/15* (2013.01); *H01L 33/62* (2013.01); *H01L 33/486* (2013.01); *H01L 2224/48091* (2013.01); *H01L 2224/48247* (2013.01); *H01L 2924/1301* (2013.01)

(58) Field of Classification Search
CPC ......... H01L 32/62; H01L 27/15; H01L 33/48; H01L 33/483; H01L 33/486
USPC ........ 257/98–100, 88–93; 438/100–111, 121, 438/123; D13/180, 182
See application file for complete search history.

(56) References Cited

U.S. PATENT DOCUMENTS

| | | | |
|---|---|---|---|
| 6,635,987 | B1 | 10/2003 | Wojnarowski et al. |
| 7,932,525 | B2 * | 4/2011 | Osamu ............................ 257/89 |
| 7,968,900 | B2 * | 6/2011 | Hussell et al. .................. 257/99 |

(Continued)

FOREIGN PATENT DOCUMENTS

| | | |
|---|---|---|
| CN | 102569277 A | 7/2012 |
| EP | 1 998 380 A2 | 12/2008 |

(Continued)

OTHER PUBLICATIONS

Japanese Office Action dated Jun. 24, 2014 issued in JP Application No. 2013-152170.

(Continued)

*Primary Examiner* — Matthew Reames
*Assistant Examiner* — Vincent Wall
(74) *Attorney, Agent, or Firm* — KED & Associates LLP

(57) ABSTRACT

Disclosed are a light emitting device and a lighting system which uses a light emitting diode. The light emitting device includes a body which has a first and a second sidewall. The sidewalls have a first length and a corresponding third and fourth sidewalls. The third and fourth sidewalls are close to the first and second sidewalls and have a second length shorter than the first length, and a concave portion which has an open upper portion. A first lead frame is disposed in the concave portion of the body which includes a first cavity having a depth lower than a bottom of the concave portion. Also, a second lead frame is disposed in the concave portion of the body and includes a second cavity having a depth lower than the bottom of the concave portion. There is a gap part between the first and second lead frames. In the first cavity is a light emitting chip, and in the second cavity there is a light emitting chip.

11 Claims, 23 Drawing Sheets

(56) References Cited

U.S. PATENT DOCUMENTS

| | | | |
|---|---|---|---|
| 2004/0188697 A1 | 9/2004 | Brunner et al. | 257/99 |
| 2006/0065957 A1 | 3/2006 | Hanya | 257/676 |
| 2007/0019416 A1 | 1/2007 | Han et al. | 362/307 |
| 2008/0273340 A1 | 11/2008 | Ng et al. | |
| 2009/0283794 A1 | 11/2009 | Mizuno et al. | |
| 2010/0123159 A1* | 5/2010 | Song et al. | 257/99 |
| 2010/0314635 A1* | 12/2010 | Brunner et al. | 257/88 |
| 2011/0175119 A1 | 7/2011 | Kim et al. | 257/91 |
| 2011/0220927 A1 | 9/2011 | Min | |
| 2011/0241054 A1* | 10/2011 | Lee et al. | 257/98 |
| 2012/0025361 A1* | 2/2012 | Ito et al. | 257/676 |
| 2012/0104426 A1* | 5/2012 | Chan et al. | 257/89 |
| 2012/0161180 A1* | 6/2012 | Komatsu et al. | 257/98 |
| 2012/0223343 A1* | 9/2012 | Kang et al. | 257/88 |

FOREIGN PATENT DOCUMENTS

| | | |
|---|---|---|
| EP | 2 346 100 A2 | 7/2011 |
| EP | 2 426 744 A2 | 3/2012 |
| JP | 2004-534405 | 11/2004 |
| JP | 2006-093435 | 4/2006 |
| JP | 2007-027765 | 2/2007 |
| JP | 2008/124195 A | 5/2008 |
| JP | 2011-134902 | 7/2011 |
| JP | 2011/134902 A | 7/2011 |
| JP | 2011-146709 | 7/2011 |
| JP | 2012-142426 | 7/2012 |

OTHER PUBLICATIONS

Japanese Office Action issued in application No. 2013-152170 dated Feb. 3, 2015.

Chinese Office Action dated Nov. 4, 2015.

European Search Report dated Nov. 12, 2015 for European Application No. 13178138.7.

* cited by examiner

LIGHT EMITTING DEVICE AND LIGHTING SYSTEM HAVING THE SAME

CROSS-REFERENCE TO RELATED APPLICATION

The present application claims priority under 35 U.S.C. §119(a) of Korean Patent Application No. 10-2012-0092594 filed on Aug. 23, 2012, which is hereby incorporated by reference in its entirety.

BACKGROUND

The embodiment relates to a light emitting device and a lighting system having the same.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by using ultraviolet ray, which is generated through the high-voltage discharge, to collide with a fluorescent substance.

In addition, the LED generates the light by using the potential gap of the semiconductor device, so the LED is advantageous as compared with conventional light sources in terms of life span, response characteristics, and environmental-friendly requirement.

In this regard, various studies have been performed to substitute the conventional light sources with the LEDs. The LEDs are increasingly used as light sources for lighting devices, such as various lamps used indoors and outdoors, liquid crystal displays, electric signboards, and street lamps.

The above references are incorporated by reference herein where appropriate for appropriate teachings of additional or alternative details, features and/or technical background.

SUMMARY

The embodiment provides a light emitting device having a body of a novel structure.

The embodiment provides a light emitting device including a first lead frame with a first cavity and a second lead frame with a second cavity in a concave portion of a body.

The embodiment provides a light emitting device including support protrusions of a lead frame which are disposed at a position higher than a bottom of the body in first and second sidewalls among sidewalls of the body, respectively.

The embodiment provides a light emitting device where a first lead part of the first lead frame is disposed in a third sidewall among the sidewalls of the body, and a second lead part of the second lead frame is disposed in the second sidewall among the sidewalls of the body.

The embodiment provides a light emitting device where support protrusions of different lead frames in which light emitting chips are mounted protrude to the first and second sidewalls of the body, respectively.

The embodiment provides a light emitting device where at least one of the lead frames includes a plurality of support protrusions protruding to the first and second sidewalls of the body.

The embodiment provides a light emitting device where the support protrusion of the lead frame is disposed higher than the lead part of the lead frame.

The embodiment provides a light emitting device including ribs formed of a material equal to a material of the body and provided at the first and second sidewalls of the body, respectively.

An embodiment provides a light emitting device including: a body including first and second sidewalls having a first length and corresponding to each other, third and fourth sidewalls close to the first and second sidewalls and having a second length shorter than the first length, and a concave portion having an open upper portion; a first lead frame disposed in the concave portion of the body and including a first cavity having a depth lower than a bottom of the concave portion; a second lead frame disposed in the concave portion of the body and including a second cavity having a depth lower than the bottom of the concave portion; a gap part between the first and second lead frames; a first light emitting chip in the first cavity; and a second light emitting chip in the second cavity, wherein the first lead frame comprises a first lead part protruding to the third sidewall of the body, and a first support protrusion in the first sidewall of the body, and wherein the second lead frame comprises a second lead part protruding to the fourth sidewall of the body, and a second support protrusion in the second sidewall of the body.

An embodiment provides a light emitting including: a body including a concave portion having an open upper portion; a first lead frame disposed in the concave portion of the body and including a first cavity having a depth lower than a bottom of the concave portion; a second lead frame disposed in the concave portion of the body and including a second cavity having a depth lower than the bottom of the concave portion; a gap part between the first and second lead frames; a first light emitting chip in the first cavity; a second light emitting chip in the second cavity; and a molding member in the first cavity and the second cavity, wherein a body comprises first and second sidewalls having a first length and corresponding to each other, and third and fourth sidewalls close to the first and second sidewalls and having a second length shorter than the first length, wherein the first lead frame comprises a first support part disposed on a bottom of the concave portion of the body, and a first support protrusion protruding to the first support part to the first sidewall of the body, wherein the second lead frame comprises a second support part disposed on a bottom of the concave portion of the body, and a second support protrusion protruding to the second support part to the second sidewall of the body, and wherein the first support protrusion and the second support protrusion are disposed at a position higher than bottom surfaces of the first and second light emitting chips based on a bottom of the body.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
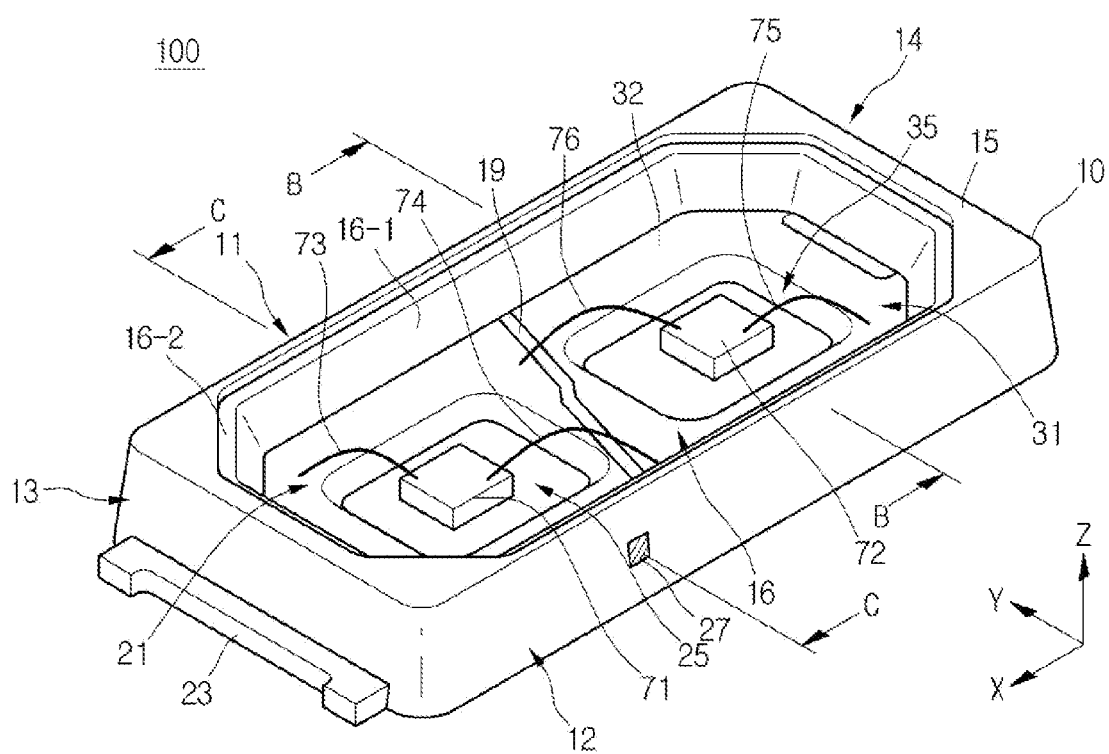
FIG. 1 is a perspective view showing a light emitting device according to a first embodiment.

In the description of the embodiments, it will be understood that when a substrate, a frame, a sheet, a layer, or a pattern is referred to as being "on" another substrate, another frame, another sheet, another layer, or another pattern, it can be "directly" or "indirectly" on the other substrate, the other frame, the other sheet, the other layer, or the other pattern may also be present. In contrast, when a part is referred to as being "directly on" another part, the intervening layer is not present. Such a position of the layer has been described with reference to the drawings. The size of elements shown in the drawings may be exaggerated for the purpose of explanation and the size of elements does not utterly reflect an actual size.

Hereinafter, embodiments will be clearly comprehended by those skilled in the art with reference to accompanying drawings and the description of the embodiments. The thickness and size of each layer shown in the drawings may be exaggerated, omitted or schematically drawn for the purpose of convenience or clarity. In addition, the size of elements does not utterly reflect an actual size. The same reference numbers will be assigned to the same elements throughout the drawings.

Hereinafter, a light emitting device according to the embodiment will be described with reference to accompanying drawings.

Figure 2:
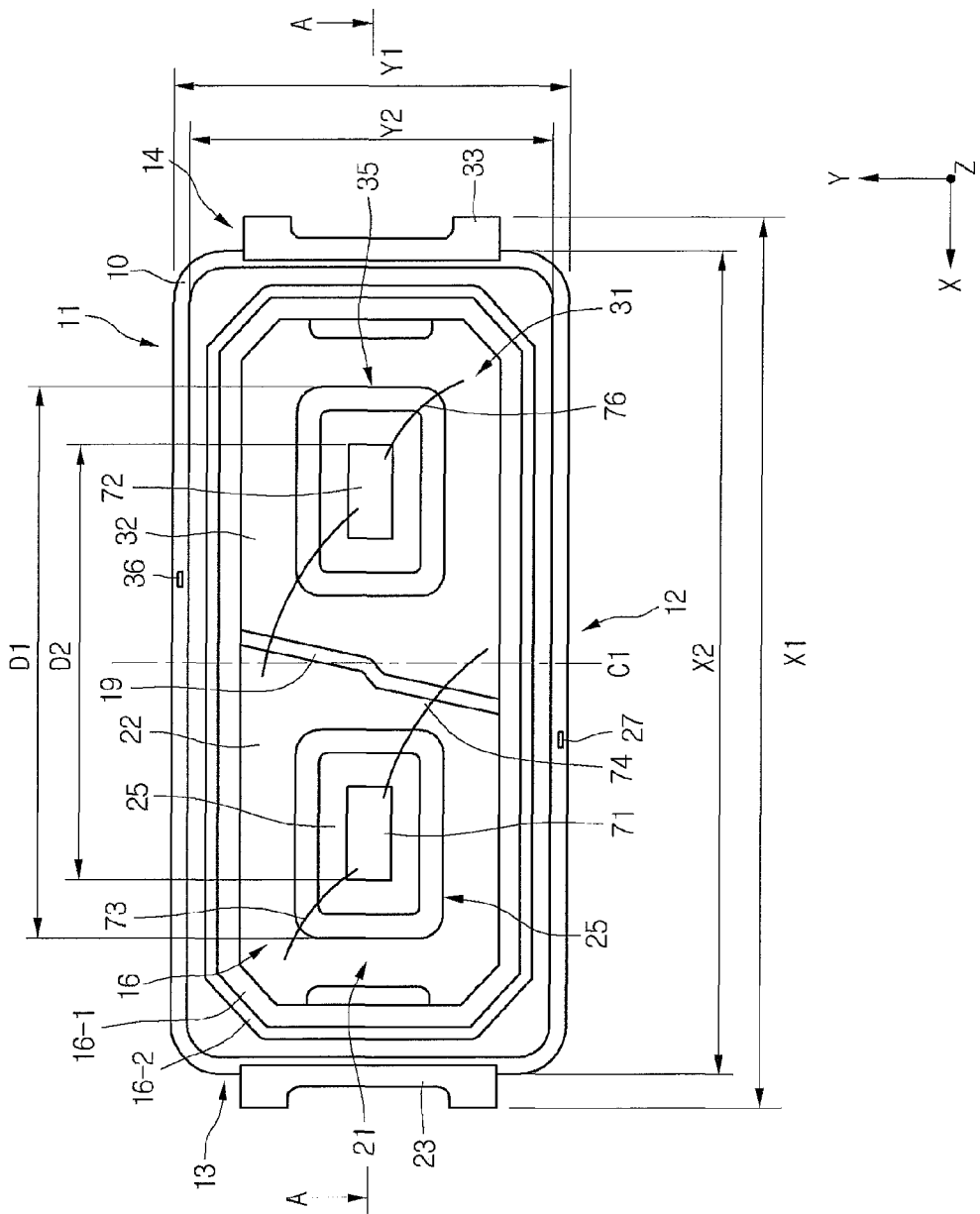
FIG. 2 is a plan view showing the light emitting device of FIG. 1.
Figure 3:
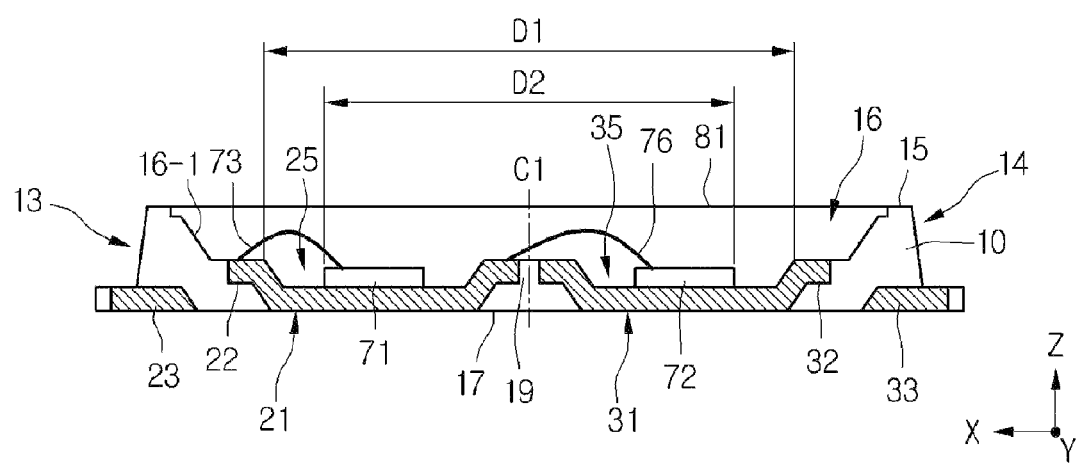
FIG. 3 is a sectional view taken along line A-A of FIG. 2.
Figure 4:
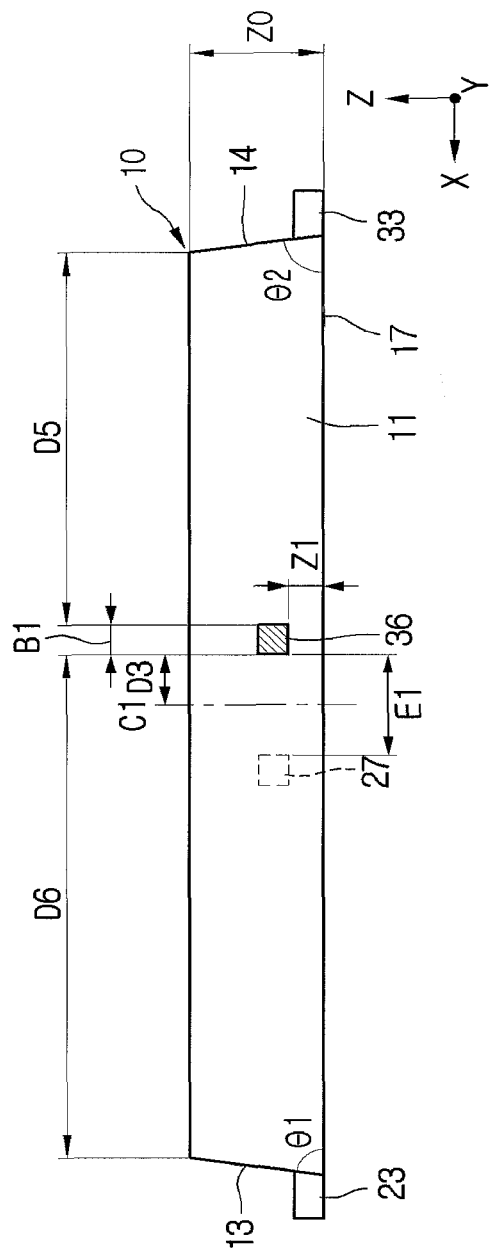
FIG. 4 is a view showing a first sidewall of the light emitting device shown in FIG. 2.
Figure 5:
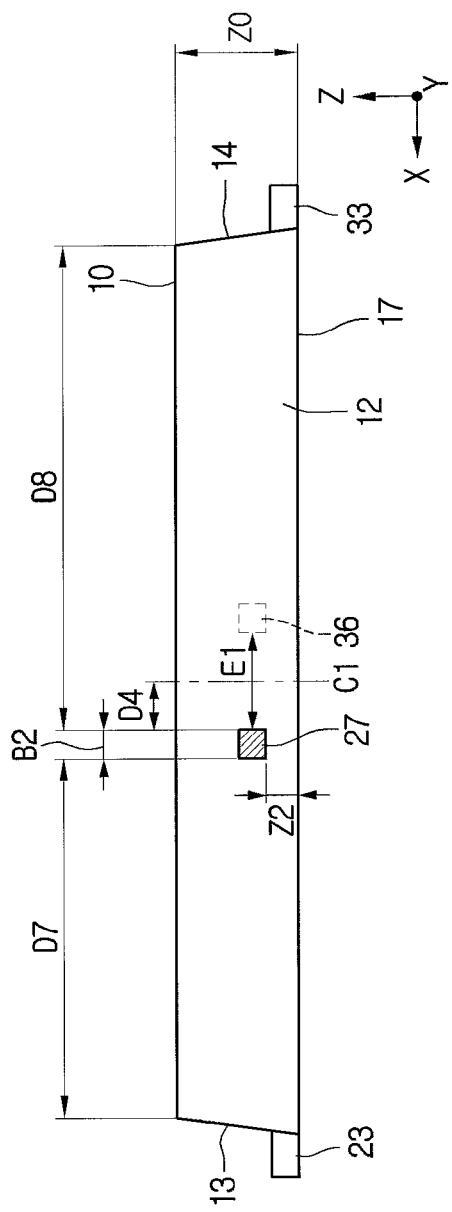
FIG. 5 is a view showing a second sidewall of the light emitting device shown in FIG. 2.
Figure 6:
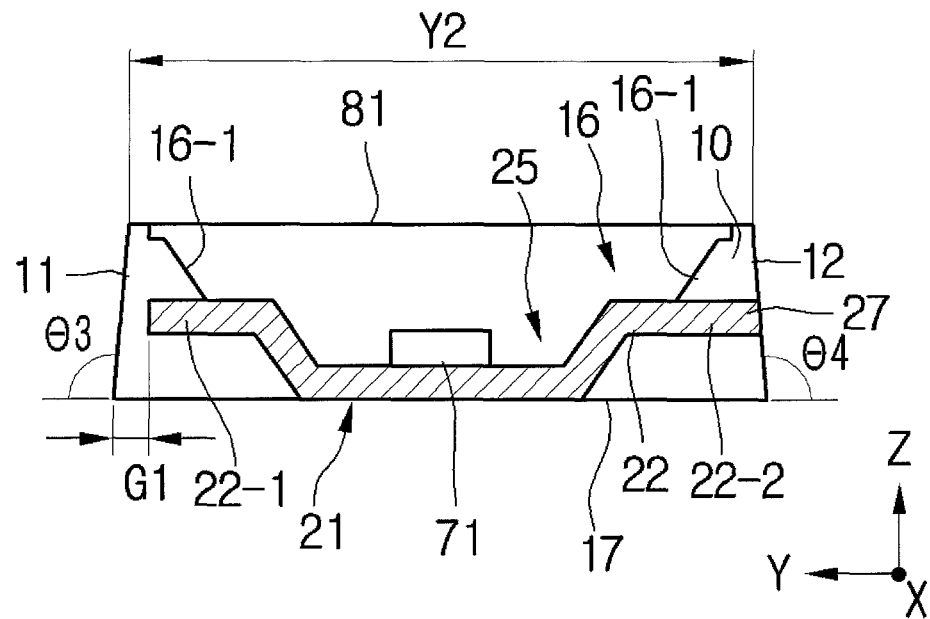
FIG. 6 is a side sectional view taken along line C-C of FIG. 1.
Figure 7:
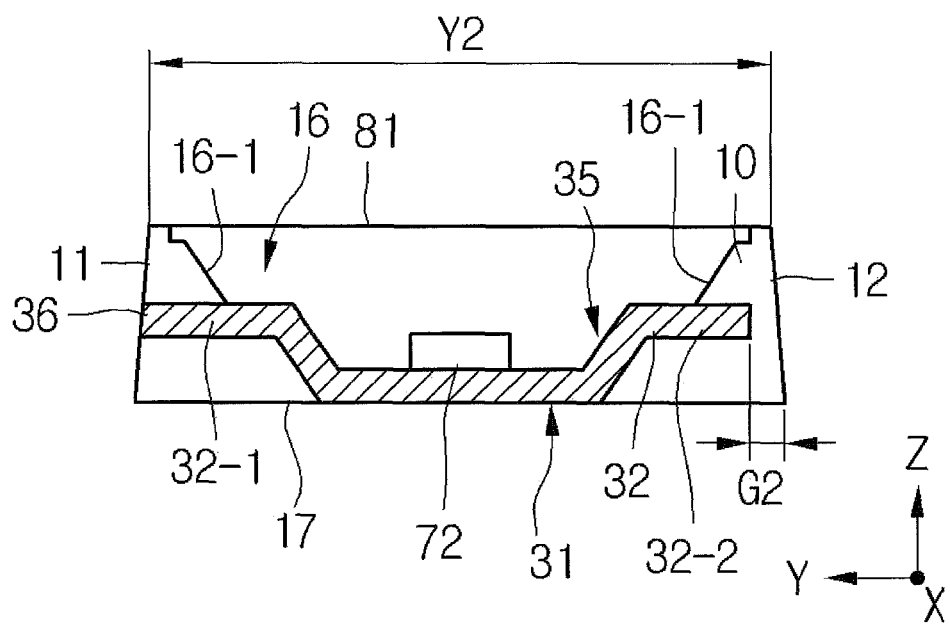
FIG. 7 is a side sectional view taken along line B-B of FIG. 1.
Figure 8:
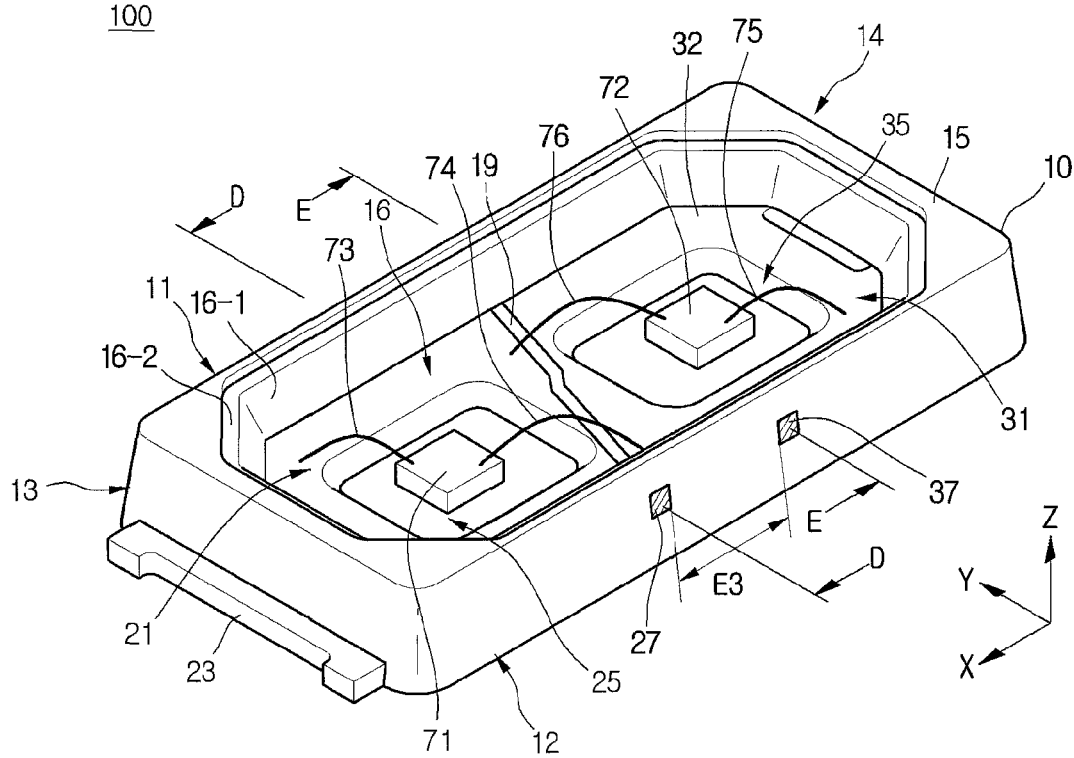
FIG. 8 is a perspective view showing a light emitting device according to a second embodiment.

FIG. 1 is a perspective view showing a light emitting device according to a first embodiment, FIG. 2 is a plan view showing the light emitting device of FIG. 1, FIG. 3 is a sectional view taken along line A-A of FIG. 2, FIG. 4 is a view showing a first sidewall of the light emitting device shown in FIG. 2, FIG. 5 is a view showing a second sidewall of the light emitting device shown in FIG. 2, and FIGS. 6 and 7 are side sectional view taken along line B-B and line C-C of FIG. 1, respectively.

Referring to FIGS. 1 to 7, the light emitting device 100 may include a body 10 having a concave portion 16, a first lead frame 21 having a first lead part 23 and a support protrusion 27, a second lead frame 31 having a second lead part 33 and a support protrusion 36, light emitting chips 71 and 72, wires 73, 74, 75, and 76, and a molding member 81.

The body 10 includes an insulating material or a conductive material. The body 10 may include at least one of a resin material, such as PPA (Polyphthalamide), Si, a metallic material, PSG (photosensitive glass), Al2O3, and PCB. For example, the body 10 may be formed of a resin material such as PPA, epoxy or Si. A filler serving as a metal oxide such as TiO2 or SiO2 may be added in an epoxy or silicon material used for the body 10 in order to increase reflection efficiency.

When viewed in a plan view, the body 10 may be formed in a structure of a polygonal shape such as a triangular shape, a rectangular shape, or a pentagonal shape, a circular shape, or a shape having a curved edge.

The body 10 includes a concave portion 16 which is recessed from an upper portion 15 at a predetermined depth, and the concave portion 16 includes an open upper portion and an inner sidewall 16-1. The concave portion 16 may be a light exit region. When viewed from the top, the concave portion 16 may have a cup structure, a cavity structure, or a recess structure recessed from the upper portion 15 of the body 10, but the embodiment is not limited thereto. The inner sidewall 16-1 of the concave portion 16 may be inclined or perpendicular with respect to a bottom. A stepped structure 16-2 is formed at the inner sidewall 16-1 of the concave portion 16 close to the upper portion 15, and may prevent a resin material from overflowing. When viewed from the top, the concave portion 16 may have a circular shape, an oval shape, a polygonal shape (e.g., rectangular shape), and a polygonal shape having curved corners of the inner sidewall 16-1.

A gap part 19 for separating a plurality of lead frames 21 and 31 from each other is formed on a bottom of the concave portion 16. The gap part 19 may have a straight line shape, a curved line shape, and an oblique line shape, but the embodiment is not limited thereto. A top region of the gap part 19 may be exposed to the bottom of the concave portion 16, and a bottom region of the gap part 19 may be exposed to a lower surface of the body 10. The top region of the gap part 19 may have a width greater than a width of the bottom region of the gap part 19. The gap part 19 may electrically protect the lead frames 21 and 23, and prevent moisture infiltration.

The body 10 may include a plurality of outer sidewalls, for example, at least four sidewalls 11, 12, 13, and 14. At least one of the sidewalls 11, 12, 13, and 14 may be a surface and/or a surface inclined and/or vertical with respect to a bottom 17 of the body 10 and bottoms of the lead frames 21 and 31. For example, as shown in FIG. 4, third and fourth sidewalls 13 and 14 among the sidewalls 11 to 14 of the body 10 may be inclined at a predetermined angle θ1 or θ2 with respect to the bottom 17 of the body 10. The angles θ1 and θ2 may have the range of 80° to 90°.

As shown in FIG. 6, the third sidewall 13 and the fourth sidewall 14 of the body 10 may have a predetermined angle θ3 or θ4, for example, the range of 90° to 100° with respect to the bottom 17 of the body 10. The sidewalls 11, 12, 13, and 14 of the body 10 may be inclined or vertically formed. Upper portions of the sidewalls 11, 12, 13, and 14 of the body 10 may be inclined or lower portions of the sidewalls 11, 12, 13, and 14 of the body 10 may be vertically formed. When the sidewalls 11, 12, 13, and 14 of the body 10 have an inclined structure, a frame for injection can be easily released.

Referring to FIG. 2, the embodiment will be made on the assumption that the body 10 includes first to fourth sidewalls 11 to 14. The first sidewall 11 and the second sidewall 12 are located opposite to each other, and the third sidewall 13 and the fourth sidewall 14 are located opposite to each other. Each length of the first sidewall 11 and the second sidewall 12 may differ from each length of the third sidewall 13 and the fourth sidewall 14. For example, each length X2 of the first sidewall 11 and the second sidewall 12 may be greater than each length Y1 of the third sidewall 13 and the fourth sidewall 14. The length X2 of the first sidewall 11 or the second sidewall 12 may be an interval between the third sidewall 13 and the fourth sidewall 14. A longitudinal direction of the body 10 is a first axis X direction which may extend through centers of first and second cavities 25 and 35 or centers of first and second light emitting chips 71 and 72. A width direction of the body 10 is a second axis Y direction, which may be perpendicular to the first axis X direction, and may be an interval between the first and second sidewalls 11 and 12.

The length X2 of the body 10 is at least twice, for example, three times longer than a width Y1 thereof. That is, lengths X2 of the first and second sidewalls 11 and 12 may be at least three times longer than lengths Y1 of the third and fourth sidewalls 13 and 14. Since the length X2 of the body 10 is longer than the width Y1 of the body 10, a middle part of the body 10 may be bent or damaged during injection-molding. The embodiment aims to prevent a yield rate of the light emitting device from being degraded due to the breakage of the body 10 caused by the length X2 of the body 10. The length X1 of the light emitting device may be longer than the length X2 of the body 10.

Each length X2 of the first and second sidewalls 11 and 12, which is the length of the body 10, represents a maximum length, and each length Y1 of the third and fourth sidewalls 13 and 14 represents a maximum length. A minimum length Y2 of the third and fourth sidewalls 13 and 14 may be shorter than the maximum length Y1. The length Y1 may be an interval between the first and second sidewalls 11 and 12 at the upper portion of the body 10, and the length Y2 may be an interval between the first and second sidewalls 11 and 12 at the bottom 17 of the body 10.

The first lead frame 21 is provided in a first region of the concave portion 16, and the first lead frame 21 is partially coupled with a bottom of the concave portion 16. The first lead frame 21 is provided therein with a first cavity 25 having a depth lower than that of the bottom of the concave portion under the concave portion 16. The first cavity 25 is concave toward the bottom surface of the body 10 from the bottom of the concave portion 16. For example, the first cavity has a cup structure or a recess shape.

The lateral sides and the bottom of the first cavity 25 are formed by bending of the first lead frame 21. The lateral sides of the first cavity 25 may be curved while being inclined with respect to the bottom of the first cavity 25 or perpendicular to the bottom of the first cavity 25. The two opposite lateral sides of the first cavity 25 may be inclined at the same angle or different angles. The bottom of the first cavity 25 may have a flat surface, and a bottom surface of the first cavity 25 may be exposed to the bottom 17 of the body 10. The bottom of the first cavity 25 may have a thickness greater than a thickness of a lateral side of the first cavity 25.

The second lead frame 31 is provided in the second region spaced apart from the first region of the concave portion 16, and a portion of the second lead frame 31 is disposed on the bottom of the concave portion 16. The second lead frame 31 is provided in an inner region thereof with a second cavity 35 which is concave at a depth lower than the bottom of the concave portion 16. The second cavity 35 and the first cavity 25 are provided at both sides of a central line C1 of the light emitting device. The second cavity 35 is concave toward the bottom surface of the body 10 from the top surface of the second lead frame 31. For example, the second cavity 35 has a cup structure or a recess shape. The lateral sides and the bottom of the second cavity 35 are formed by bending of the second lead frame 31. The lateral sides of the second cavity 35 may be curved while being inclined with respect to the bottom of the second cavity 35 or perpendicular to the bottom of the second cavity 35. The two opposite lateral sides of the second cavity 35 may be inclined at the same angle or different angles. The bottom of the second cavity 35 may have a flat surface, and a bottom surface of the second cavity 35 may be exposed to the bottom 17 of the body 10. A bottom of the second cavity 25 may have a thickness greater than that of a lateral side of the second cavity 35.

The first cavity 25 may be formed on the first lead frame 21 or may be formed by bending the first lead frame 21. The second cavity 35 may be formed on the second lead frame 31 or may be formed by bending the second lead frame 31. The concave portion 16 may be connected to regions of the first cavity 25 and the second cavity 35. Bottom surfaces of the first and second cavities 25 and 35 may be exposed to an open region of the bottom 17 of the body 10.

The bottom of the first cavity 25 is disposed at a position lower than the bottom of the concave portion 16, and the bottom of the second cavity 35 is disposed at a position lower than the bottom of the concave portion 16.

The first lead frame 21 includes a first support part 22. The first support part 22 is provided on a bottom of the concave portion 16, and is disposed at a position higher than a bottom of the first cavity 25. Further, a periphery of the first cavity 25 is bent from the first support part 22 of the first lead frame 21. The second lead frame 31 includes a second support part 32. The second support part 32 is provided on a bottom of the concave portion 16, and is disposed at a position higher than a bottom of the second cavity 35. Further, a periphery of the second cavity 35 is bent from the second support part 32 of the second lead frame 31.

The first and second support parts 22 and 32 of the first and second lead frames 21 and 31 may occupy at least 80% of an area of a bottom of the concave portion 16, respectively. Accordingly, the first and second support parts 22 and 32 may efficiently reflect the light from the bottom of the concave portion 16.

The first lead frame 21 and the second lead frame 31 may include a metallic material. For example, the first lead frame 21 and the second lead frame 31 may include at least one of titanium (Ti), copper (Cu), nickel (Ni), gold (Au), chrome (Cr), tantalum (Ta), platinum (Pt), tin (Sn), silver (Ag), and phosphor (P). In addition, the first lead frame 21 and the second lead frame 31 may include a single metallic layer or a multi-layer metallic layer. For example, the first and second lead frames 21 and 31 may include a plating layer laminated on a copper material. The plating layer may be formed in at least one layer. The first and second lead frames 21 and 31 may be formed at the same thickness, but the embodiment is not limited thereto. The first lead frame 21 and the second lead frame 31 may have a thickness having 0.15 mm or greater, for example, 0.18 mm or greater.

When viewed from the top, the first cavity 25 and the second cavity 35 may have the same shape or different shapes, but the embodiment is not limited thereto. Bottoms of the first cavity 25 and the second cavity 35 may have a rectangular shape, a square shape, a shape having a partial curved surface, a circular shape, an oval shape, but the embodiment is not limited thereto. A bottom surface of the first cavity 25 may be spaced apart from a bottom surface of the second cavity 35.

A first light emitting chip 71 is provided in the first cavity 25 of the first lead frame 21. The first light emitting chip 71 adheres to the bottom of the first cavity 25 by an adhesive member (not shown) such as a solder or an adhesive. A second light emitting chip 72 is provided in the second cavity 35 of the second lead frame 31. The second light emitting chip 72 adheres to a bottom of the second cavity 35 by an adhesive member (not shown) such as a solder or an adhesive. The adhesive may include an insulating material such as an epoxy or silicon. The adhesive may further include a metal oxide to improve a thermal conductivity, but the embodiment is not limited thereto.

The first and second light emitting chips 71 and 72 may selectively emit lights ranging from a visible light band to a UV (ultraviolet) light band. For example, the first and second light emitting chips 71 and 72 may selectively include a red LED chip, a blue LED chip, a green LED chip, a yellow green LED chip, and an Ultraviolet (UV) chip. The first and second light emitting chips 71 and 72 may include an LED chip having at least one of compound semiconductors of the group III-V elements and compound semiconductors of the group II-VI elements.

Bottom surfaces of the first and second light emitting chips 71 and 72 may be provided at a position lower than the first and second support parts 22 and 32 of the first and second lead frames 21 and 31, respectively. Further, since lateral sides of the first cavity 25 correspond to each other, a periphery of the first light emitting chip 71 may efficiently reflect light emitted from the first light emitting chip 71. Since lateral sides of the second cavity 25 correspond to each other, a periphery of the second light emitting chip 71 may efficiently reflect light emitted from the second light emitting chip 72.

The first light emitting chip 71 is connected to the first support part 22 of the first lead frame 21 through the first wire 73, and connected to the second support part 32 of the second lead frame 31 through the second wire 74. The second light emitting chip 72 is connected to the first support part 22 through the third wire 75, and connected to the second support part 32 through the fourth wire 76.

A protective device (not shown) may be provided on at least one of the first lead frame 21 or the second lead frame 31. Further, the protective device may be disposed on a bottom of the concave portion 16, but the embodiment is not limited thereto. The protective device may include a thyristor, a Zener diode, or a TVS (transient voltage suppression). The Zener diode protects the light emitting chip from an electro static discharge (ESD). The protective device is connected to the connection circuit of the first and second light emitting chips 71 and 72 in parallel, thereby protecting the light emitting chips 71 and 72.

As shown in FIGS. 2 and 3, the first lead frame 21 includes a first lead part 23. The first lead part 23 may protrude from the first support part 22 to a third sidewall 13 through an inside of the body 10. The first lead part 23 extends to a bottom of the body 10, and may be provided at a position lower than the first support part 22.

The second lead frame 31 includes a second lead part 33. The second lead part 33 may protrude from the second support part 32 to a fourth sidewall 14 through the inside of the body 10. The second lead part 33 extends to a bottom of the body 10, and may be provided at a position lower than the second support part 32.

At least one of the first lead part 23 and the first cavity 25 of the first lead frame 21 is mounted in a board so that power is supplied. At least one of the second lead part 33 and the second cavity 35 of the second lead frame 31 is mounted in a board so that power is supplied. FIG. 2 also shows a distance D1, which is a distance between a lateral side of the first cavity 25 and the lateral side of the second cavity 35. A distance D2 is a maximum distance between outer sides of the first and second light emitting chips 71, 72.

As shown in FIGS. 5 and 6, the first lead frame 21 includes a first extension portion 22-1 extending to a region close to the first sidewall 11 from the first support part 22, a second extension portion 22-2 extending to a region close to the second sidewall 12 from the first support part 22, and a support protrusion 27 exposed to the second sidewall 12 of the body 10. The first extension portion 22-1 and the second extension portion 22-2 extend from a bottom of the concave portion 16 to a region between the bottom and the upper portion of the body 10 in a direction of the first and second side walls 11 and 12. A straight length in a Y axis direction of the first lead frame 21 is shorter than a minimum length Y2 in a Y axis direction of the body 10. The support protrusion 27 protrudes horizontally with the second extension portion 22-2.

The support protrusion 27 of the first lead frame 21 protrudes from the first extension portion 22-1 and is exposed to the second sidewall 12. A gap G1 between the first sidewall 11 and the first extension port 22-1 may be 0.01 mm or greater. The first and second extension portions 22-1 and 22-2 may be spaced apart from the first and second sidewalls 11 and 12, respectively, by a distance equal to or different from the above gap G1. The gap G1 may be an interval between a segment vertical to a bottom 17 of the body 10 based on an edge part of the first sidewall 11 of the body 10 and the first extension portion 22-1.

As shown in FIG. 5, the support protrusion 27 of the first lead frame 21 is spaced apart from a central line C1 of the second sidewall 12 in a direction of the third sidewall 13 by a distance D4. The support protrusion 27 of the first lead frame 21 may be spaced part from the bottom 17 of the body 10 by a predetermined distance Z2, for example, 0.1 mm or greater. The distance Z2 may be less than a thickness Z0 of the second sidewall 12, less than half of the thickness Z0. When the distance Z2 is too short, the body 10 located below the support protrusion 27 may not be easily formed. When the distance Z2 is too long, the thickness of the body 10 becomes thicker.

The support protrusion 27 of the first lead frame 21 is close to the central line C1 of the body 10 so that a distance D7 between the support protrusion 27 and the third sidewall 13 is less than a distance D8 between the support protrusion 27 and the fourth sidewall 14.

As shown in FIGS. 4 and 7, the second lead frame 31 includes a third extension portion 32-1 extending to a region close to the first sidewall 11 from the second support part 32, a fourth extension portion 32-2 extending to a region close to the second sidewall 12 from the first support part 32, and a support protrusion 36 exposed to the first sidewall 11 of the body 10. The third extension portion 32-1 and the fourth extension portion 32-2 extend from a bottom of the concave portion 16 to a region between the bottom and the upper portion of the body 10 in a direction of the first and second side walls 11 and 12. A straight length in a Y axis direction of the second lead frame 31 is shorter than a minimum length Y2 in a Y axis direction of the body 10. The support protrusion 36 protrudes horizontally with the third extension portion 32-1.

The support protrusion 36 of the second lead frame 31 protrudes from the third extension portion 32-1 and is disposed at the first sidewall 11. A gap G2 between the first sidewall 11 and the fourth extension port 32-2 may be 0.01 mm or greater. The third and fourth extension portions 32-1 and 32-2 may be spaced apart from the first and second sidewalls 11 and 12, respectively, by a distance equal to or different from the above gap G2. The gap G2 may be an interval between a segment vertical to a bottom 17 of the body 10 based on an edge part of the second sidewall 12 of the body 10 and the fourth extension portion 32-2.

The support protrusion 36 of the second lead frame 31 is spaced apart from a central line C1 of the first sidewall 11 in a direction of the fourth sidewall 14 by a distance D3 and is spaced apart from the bottom 17 of the body by a predetermined distance Z1. For example, the predetermined distance Z1 may be 0.1 mm or greater. The distance Z1 may be less than a thickness Z0 of the first sidewall 11, for example, be less than half of the thickness Z0. When the distance Z1 is too short, the body 10 located below the support protrusion 36 may not be easily formed. When the distance Z1 is too long, the thickness of the body 10 becomes thicker.

The support protrusion 36 of the second lead frame 31 is close to the central line C1 of the body 10 so that a distance D5 between the support protrusion 36 and the fourth sidewall 14 is less than a distance D6 between the support protrusion 36 and the third sidewall 14.

The support protrusion 27 of the first lead frame 21 and the support protrusion 36 of the second lead frame 31 are provided at the first and second sidewalls 11 and 12, respectively, and are located opposite to each other based on the central line C1. The central line C1 may extend through the center of the gap part 19. Accordingly, the support protrusions 27 and 36 may be exposed to a part of the first sidewall 11 or the second sidewall 12 corresponding to a region between the gap part 19 and respective light emitting chips 71 and 72. The distance D3 between the support protrusion 36 and the central line C1 is the same as the distance D4 between the support protrusion 27 and the central line C1 or one of the support protrusions 36 and 27 may be disposed closer to the central line C1 than to the other support protrusion. The support protrusion 27 of the first lead frame 21 is disposed closer to the gap part 19 or the central line C1 as compared with the third sidewall 13. The support protrusion 36 of the second lead frame 31 is disposed closer to the gap part 19 or the central line C1 than to the fourth sidewall 14.

Bottom surfaces of the support protrusions 27 and 36 are provided at a position higher than the bottom 17 of the body 10 and bottom surfaces of the first and second light emitting chips 71 and 72.

As shown in FIGS. 4 and 5, an interval E1 between a segment vertical to the first sidewall 11 based on the support protrusion 36 of the second lead frame 31 and a segment vertical to the second sidewall 12 based on the support protrusion 27 of the first lead frame 21 may be wider than a width of the gap part 19 of FIG. 3. The gap part 19 is a region between a bottom of the concave portion 16 and the first and second lead frames 21 and 31. The interval E1 may be a horizontal interval between two segments.

A width B1 of the support protrusion 36 of the second lead frame 31 and a width B2 of the support protrusion 37 of the first lead frame 21 may be 50 μm or greater, for example, have the range of 50 μm to 500 μm. The support protrusions 27 and 36 may be the same thicknesses than those of the first and second lead frames 21 and 31, but the embodiment is not limited thereto. A plating layer may be removed from surfaces of the support protrusions 27 and 36 exposed to the first and second sidewalls 11 and 12, and a layer such as a copper layer may be exposed from the surfaces of the support protrusions 27 and 36.

Widths B1 and B2 of the support protrusions 27 and 36 may be narrower than widths of top surfaces of the light emitting devices 21 and 31, respectively. The widths of top surfaces of the light emitting devices 21 and 31 may be a width in an X axis direction or a Y axis direction. That is, when the widths B1 and B2 of the support protrusions 27 and 36 are too wide, moisture may be infiltrated into the support protrusions 27 and 36 or the support protrusions 27 and 36 may be oxidized. When the widths of the support protrusions 27 and 36 are too narrow, the support protrusions 27 and 36 cannot be supported upon manufacture of the body 10. Top surfaces and bottom surfaces of the support protrusions 27 and 36 are coupled in the body 10, and end surfaces, that is, cutting surfaces of the support protrusions 27 and 36 are provided at the first and second sidewalls 11 and 12. Accordingly, exposed areas of the support protrusions 27 and 36 may be minimized. Edge parts of top surfaces of the support protrusions 27 and 36 may be exposed depending on a cutting angle and inclined angles of the first and second sidewalls 11 and 12, but the embodiment is not limited thereto.

Referring to FIGS. 3 to 5, the support protrusions 27 and 36 of the first and second lead frames 21 and 31 are provided close to the central line C1, and may ensure the stiffness in a central region of the light emitting device. The interval E1 may be greater than a distance D2, that is, a maximum distance between outer sides of the first and second light emitting chips 71 and 72. That is, the support protrusion 27 of the first lead frame 21 may be provided in a region between the central line C1 of the light emitting device and the outer side of the first light emitting chip 71. The support protrusion 36 of the second lead frame 31 may be provided a region between the central line C1 of the light emitting device 100 and the outer side of the second light emitting chip 72. As another example, the interval E1 may be smaller than a straight distance D1 between a lateral side of the first cavity 25 and a lateral side of the second cavity 35. The straight distance D1 may be a straight section connecting an outer side of the first cavity 25 close to the third sidewall 13 to an outer side of the second cavity 35 close to the fourth sidewall 14. The straight distance D1 may become a maximum section among sections connecting outer sides of the first cavity 25 to outer sides of the second cavity 35.

The support protrusions 27 and 36 are exposed to the first and second sidewalls 11 and 12 of the body 10 so that central regions of the first lead frame 21 and the second lead frame 31 may be prevented from being twisted upon injection-molding of the body 10. In addition, the stiffness can be ensured at the boundary region between the first and second lead frames 21 and 31 which is a region of the gap part 19.

A bottom surface of the first cavity 25 and the first lead part 23 of the first lead frame 21, and a bottom surface of the second cavity 35 and the second lead part 33 of the second lead frame 31 may be mounted on a circuit board (not shown). The first and second lead frames 21 and 31 supply power, and perform a heat radiation function.

The molding member 81 may be formed in the concave portion 16, the first cavity 25, and the second cavity 35. The molding member 81 may include a transmissive resin layer including silicon or epoxy, and may include a single layer or a multi-layer.

The molding member 81 may include a phosphor to convert the wavelength of light upward emitted from the light emitting chips 71 and 72. The phosphor may be contained in at least one of the first and second cavities 25 and 35, but the embodiment is not limited thereto. The phosphor excites a portion of light emitted from the light emitting chips 71 and 72 so that light having a different wavelength can be emitted. The phosphor may selectively include one of YAG, TAG, Silicate, Nitride, and Oxy-nitride. The phosphor may include at least one of red, yellow, and green phosphors, but the embodiment is not limited thereto. The molding member 81 may have a flat surface, a concave surface, or a convex surface, but the embodiment is not limited thereto.

A surface of the molding member 81 may be a light emitting surface. A lens may be disposed on the upper side of the molding member 81. The lens may include a convex lens, a concave lens, and a convex lens having a specular reflection surface, but the embodiment is not limited thereto.

FIGS. 8 to 12 are views showing a light emitting device according to the second embodiment. In the following description of the second embodiment, the elements the same as those of the first embodiment are described by making reference to the description of the first embodiment, and the details thereof will be omitted in order to avoid redundancy.

Referring to FIGS. 8 to 12, the light emitting device 100 may include a body 10 having a concave portion 16, a first lead frame 21 having support protrusions 26 and 27, a second lead frame 31 having support protrusions 36 37, light emitting chips 71 and 72, wires 73, 74, 75, and 76, and a molding member 81. The concave portion 16 includes an open upper portion and may be connected to regions of the first cavity 25 and the second cavity 35.

The first lead frame 21 includes a plurality of support protrusions 26 and 27, and the support protrusions 26 and 27 may be provided at different sidewalls, respectively. The second lead frame 31 includes a plurality of support protrusions 36 and 37, and the support protrusions 36 and 37 may be provided at different sidewalls, respectively. For the purpose of convenience of the description, the support protrusions 26 and 27 of the first lead frame 21 refer to first and second support protrusions, and the support protrusions 36 and 37 of the second lead frame 31 refer to third and fourth support protrusions, respectively.

The first lead frame 21 includes a first support protrusion 26 protruding from the first support part 22 to be exposed to the first sidewall 11, and a second support protrusion 27 protruding from the first support part 22 and exposed to the second sidewall 12. The second lead frame 31 includes a third support protrusion 36 protruding from the second support part 32 and exposed to the first sidewall 11, and a fourth support protrusion 37 protruding from the second support part 32 and exposed to the second sidewall 12. The first to fourth support protrusions 26, 27, 36, and 37 are provided at a position lower than the upper portion 15 of the body 10 and higher than the bottom 17 of the body 10.

The first support protrusion 26 and the third support protrusion 36 provided at the first sidewall 11 correspond to each other based on the center line C1, and are disposed closer to the central line C1 than to the third and fourth sidewalls 13 and 14.

The second support protrusion 27 and the third support protrusion 36 provided at the second sidewall 12 correspond to each other based on the center line C1, and are disposed closer to the central line C1 than to the third and fourth sidewalls 13 and 14.

Figure 9:
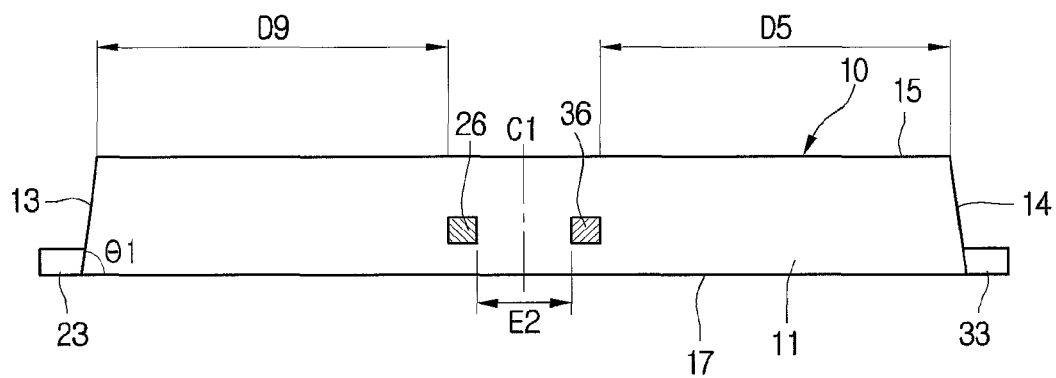
FIG. 9 is a view showing a first sidewall of the light emitting device shown in FIG. 8.
Figure 10:
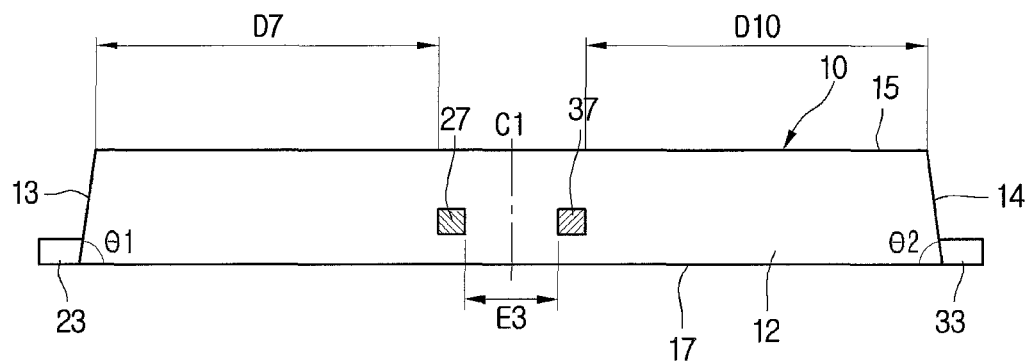
FIG. 10 is a view showing a second sidewall of the light emitting device shown in FIG. 8.

As shown in FIGS. 9 and 10, an interval E2 between the first support protrusion 26 and the third support protrusion 36 may be the same as or different from an interval E3 between the second support protrusion 27 and the fourth support protrusion 37. An interval D9 between the first support protrusion 26 and the third sidewall 13 may be the same as an interval D5 between the third support protrusion 36 and the fourth sidewall 14. As another example, the intervals D9 and D5 may be the same as each other. Further, each of the intervals E2 and E3 may be greater than a width of a top surface of the gap part 19.

As shown in FIG. 3, the interval E2 between the first support protrusion 26 and the third support protrusion 36 may be less than a distance D2 between an outer side of the first light emitting chip 71 and an outer side of the second light emitting chip 72. The interval E2 may be less than a straight line D1 connecting a lateral side of the first cavity 25 to a lateral side of the second cavity 35.

As shown in FIG. 3, the interval E3 between the second support protrusion 27 and the fourth support protrusion 37 may be less than the distance between an outer side of the first light emitting chip 71 and an outer side of the second light emitting chip 72 or may be less than a straight distance D1 among distances between lateral sides of the first cavity 25 and lateral sides of the second cavity 35. The interval D7 between the second support protrusion 27 and the third sidewall 13 may be the same as the interval D10 between the fourth support protrusion 37 and the fourth sidewall 14. The intervals D7 may be different from the interval D10.

Figure 11:
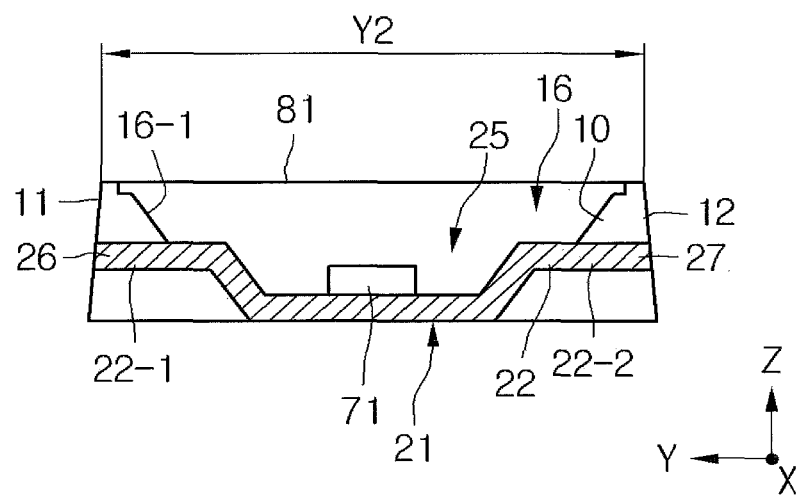
FIG. 11 is a side sectional view taken along line D-D of FIG. 8.
Figure 12:
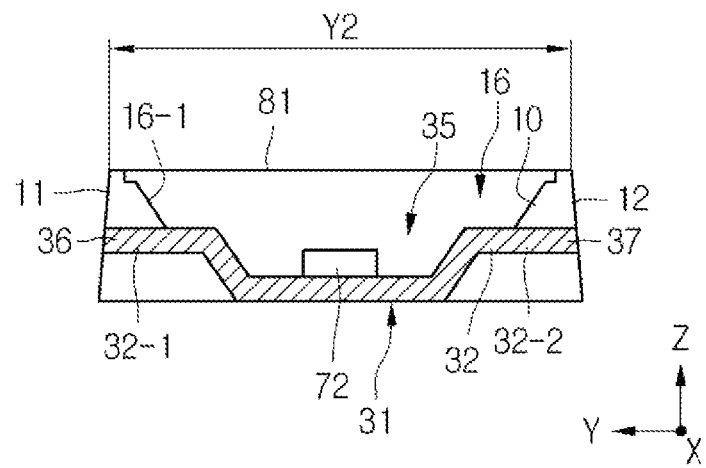
FIG. 12 is a side sectional view taken along line E-E of FIG. 8.

Referring to FIGS. 11 and 12, the first support protrusion 26 of the first lead frame 21 protrudes from a part of a first extension portion 22-1 close to the first sidewall 11, and the second support protrusion 27 of the first lead frame 21 protrudes from a part of a second extension portion 22-2 close to the second sidewall 12. The third support protrusion 36 of the second lead frame 31 protrudes from a part of a third extension portion 32-1 close to the first sidewall 11, and the fourth support protrusion 37 of the second lead frame 21 protrudes from a part of a fourth extension portion 32-2 close to the second sidewall 12. A plating layer may be removed from surfaces of the firth to fourth support protrusions 26, 27, 36, and 37 exposed to the first and second sidewalls 11 and 12, and a layer such as a copper layer may be exposed from the surfaces of the firth to fourth support protrusions 26, 27, 36, and 37.

Widths of firth to fourth support protrusions 26, 27, 36, and 37 may be 0.1 mm or greater. Thicknesses of the firth to fourth support protrusions 26, 27, 36, and 37 may be the same as, less than, or greater than a thickness of the first lead frame 21 or the second lead frame 31.

A length, that is, a straight length in an Y axis direction of the first lead frame 21 is greater than a minimum length Y2 in a Y axis direction of the body 10. That is, the distance between the first and second support protrusions 26 and 27 may be greater than the length Y2 of the body 10. Further, a length, that is, a straight length in a Y direction of the second lead frame 31 is greater than a minimum length Y2 in a Y direction of the body 10. That is, the distance between the third and fourth support protrusions 36 and 37 may be greater than the length Y2 of the body 10.

In the second embodiment, since a plurality of support protrusions 26, 27, 36, and 37 are disposed at opposite sidewalls 11 and 12 of the first and second lead frames 21 and 31, a center region of the light emitting device may be prevented from being sagged when the injection-molding is performed using the body 10. Accordingly, a yield rate of the light emitting device may be improved.

Further, the protrusions 26, 27, 36, and 37 of the first and second lead frames 21 and 31 protrude horizontally with respective extension portions. Accordingly, the support protrusions 26, 27, 36, and 37 can increase adhesive strength with respect to the body 10.

Figure 13:
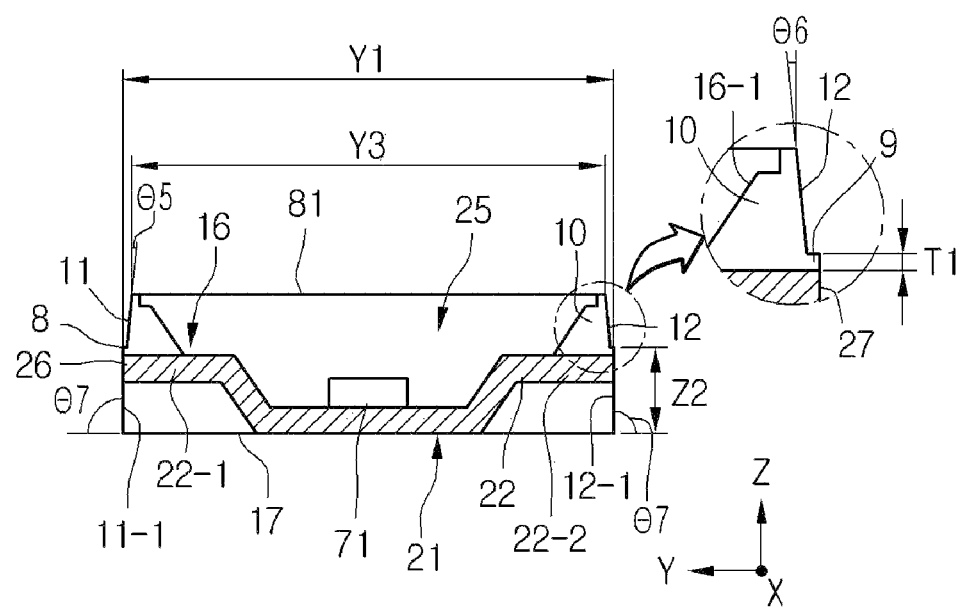
FIGS. 13 and 14 are views illustrating other examples of FIG. 12, respectively.
Figure 14:
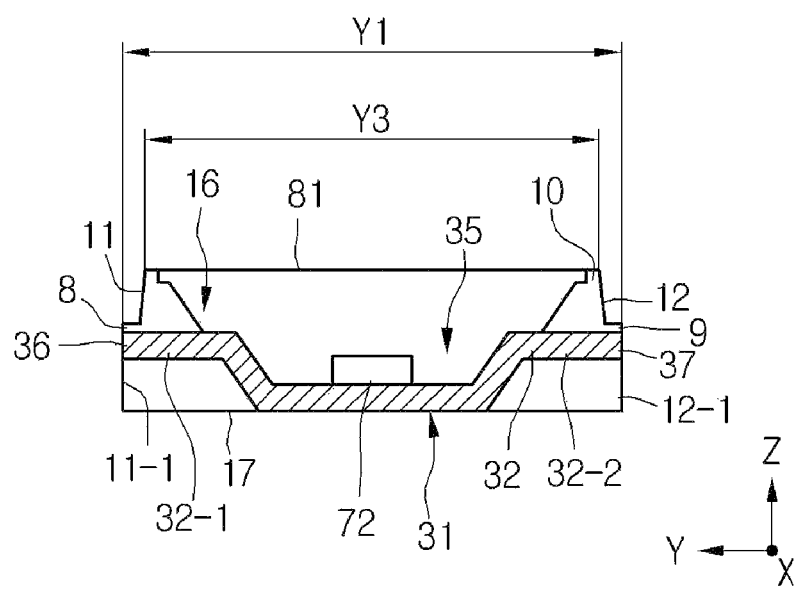

FIGS. 13 and 14 are views illustrating other examples of FIG. 12, respectively.

Referring to FIGS. 13 and 14, the light emitting device include a first outer portion 8 formed at the first sidewall 11 of the body 10 and a second outer portion 9 formed at a second sidewall 12 of the body 10. The first outer portion 8 is stepped from the first sidewall 11 in an outward direction, and covers outer peripheral portions of the first and third support protrusions 26 and 36. The first outer portion 8 may include a horizontal surface or a surface parallel with the bottom 17 of the body 10. When the first sidewall 11 is inclined at a predetermined angle θ5 with respect to a vertical Z axis direction, a lower sidewall 12-1 of the first outer portion 8 may be formed at an angle θ7 in the range of about 89° to about 90°, that is, a right angle with respect to the bottom 17 of the body 10. The angle θ5 may have a range of 1° to 5°. The second outer portion 9 is stepped outward from the second sidewall 12, and covers outer peripheral portions of the second and fourth support protrusions 27 and 37. The second outer portion 9 may include a horizontal surface or a surface parallel with the bottom 17 of the body 10. When the second sidewall 12 is inclined at a predetermined angle θ6 with respect to a vertical Y axis direction, an outer side 12-1 of the second outer portion 8 may be formed at an angle θ7 in the range of about 89° to about 90°, that is, a right angle with respect to the bottom 17 of the body 10. The angle θ6 may be in the range of 1° to 5°.

The first to fourth support protrusions 26, 27, 36, and 37 are spaced apart from top surfaces of the first and second outer portions 8 and 9 by a predetermined interval T1. The top surfaces of the first and second outer portions 8 and 9 are disposed higher than the top surfaces of the first to fourth support protrusions 26, 27, 36, and 37. Accordingly, the top surfaces of the first to fourth support protrusions 26, 27, 36, and 37 may be prevented from being exposed. The first and second outer portions 8 and 9 of the body 10 cover the top surfaces of the first to fourth support protrusions 26, 27, 36, and 37 of the first lead frame 21 and the second lead frame 31 so that impact applied to the first to fourth support protrusions 26, 27, 36, and 37 during cutting can be attenuated. In addition, a gap can be prevented from being formed at the interfacial surface between the first to fourth support protrusions 26, 27, 36, and 37 and the body 10.

The first and second outer portions 8 and 9 serve as ribs in the first and second sidewalls 11 and 12. For example, the first outer portion 8 is provided at a region (region E2 of FIG. 8) between the first and third support protrusions 26 and 36, the first outer portion 8 may serve as a rib for reinforcing the stiffness of a center region of the light emitting device. The second outer portion 9 is provided at a region (region E3 of FIG. 8) between the second and fourth support protrusions 27 and 37, the second outer portion 9 may serve as a rib for reinforcing the stiffness of the center region of the light emitting device.

A maximum length, that is, a maximum straight length in a Y axis direction of the first lead frame 21 may be the same as the length Y1 of the body 10 or a width of the bottom 17 of the body 10. The straight length in a Y axis direction of the first lead frame 21 is an interval between the first and second support protrusions 26 and 27.

A maximum length, that is, a maximum straight length in a Y axis direction of the second lead frame 31 may be the same as the length Y1 of the body 10 or a width of the bottom 17 of the body 10. The straight length in a Y axis direction of the second lead frame 31 is an interval between the third and fourth support protrusions 36 and 37.

Further, the maximum straight lengths in the Y directions of the first and second lead frames 21 and 31 may be greater than a width Y3 of an upper portion of the body 10.

Figure 15:
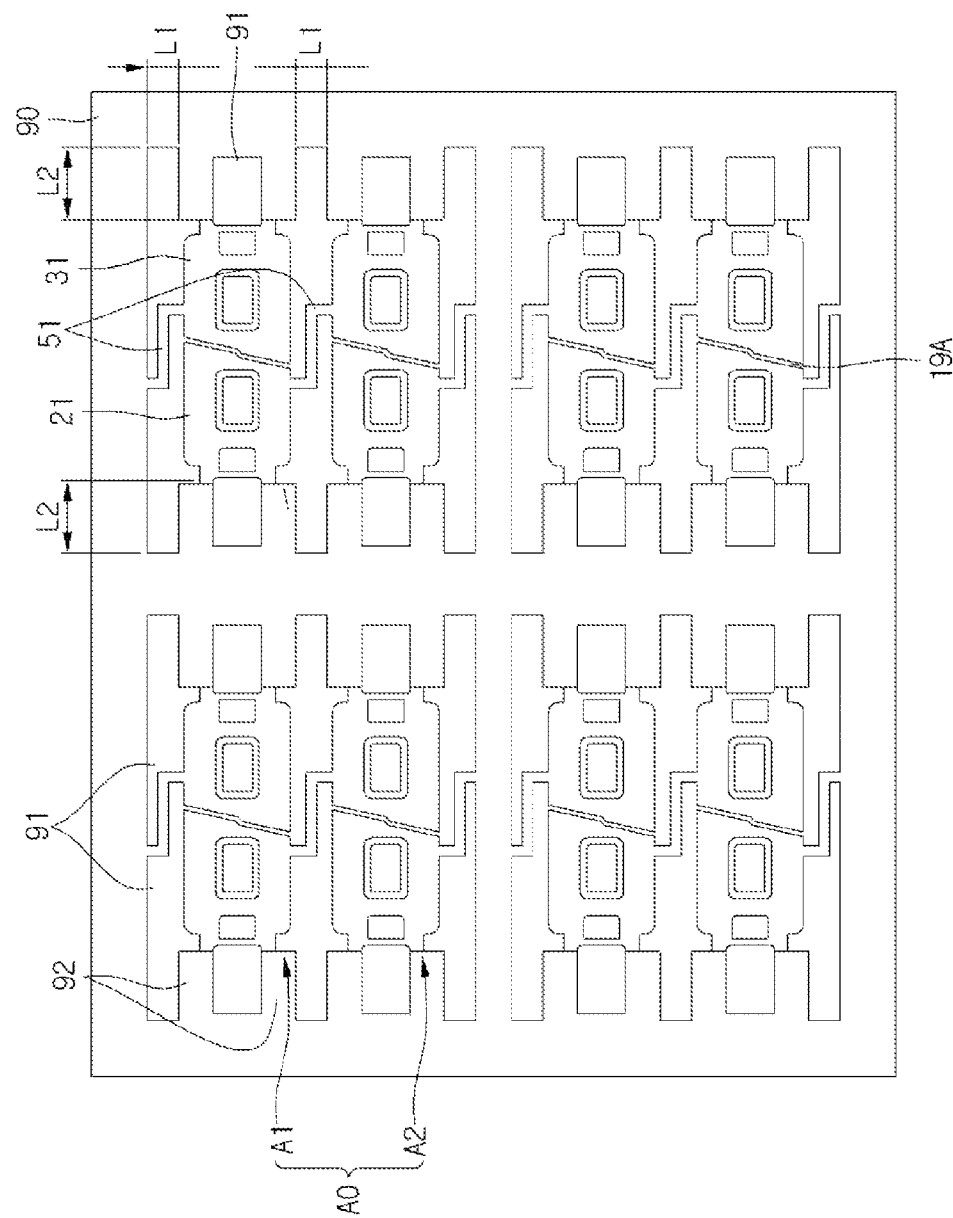
FIGS. 15 to 17 are views illustrating a procedure of manufacturing the light emitting device of FIG. 1.
Figure 16:
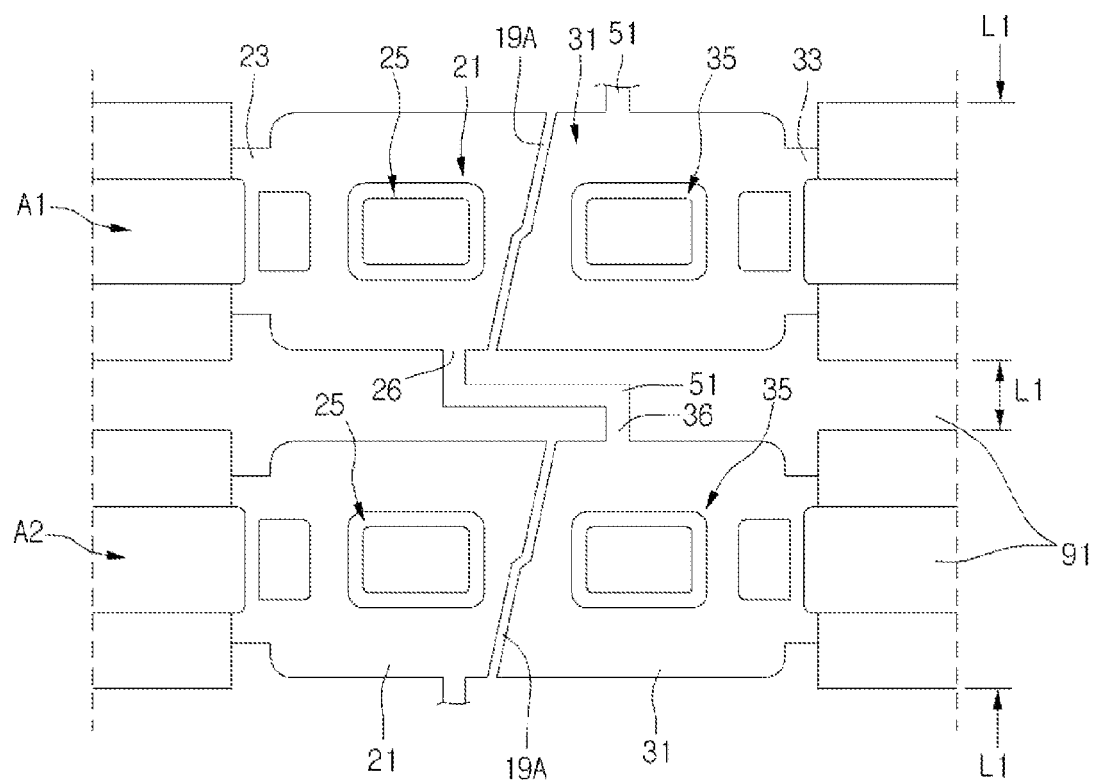
Figure 17:
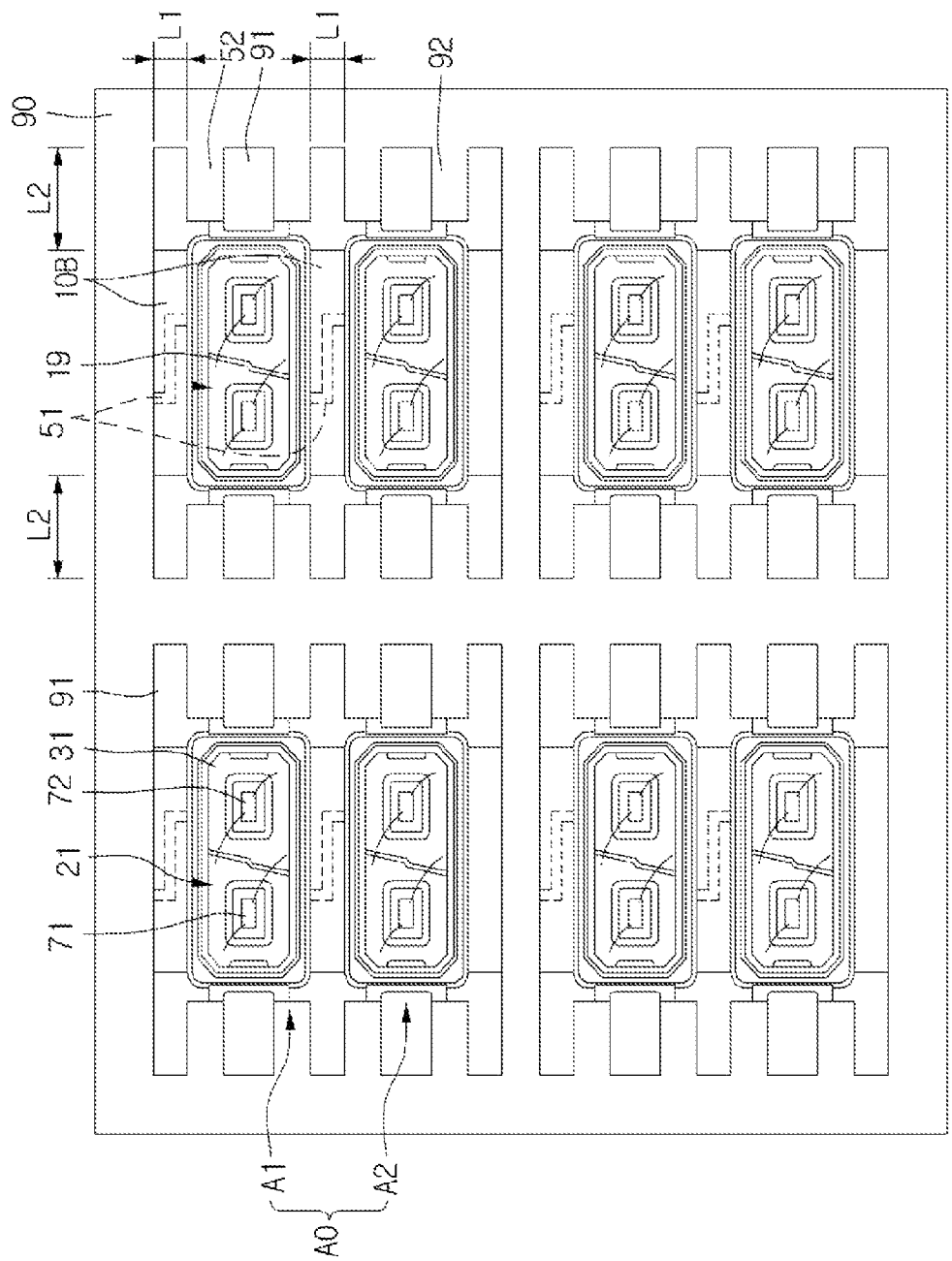

FIGS. 15 to 17 are views illustrating a procedure of manufacturing the light emitting device of FIG. 1. The embodiment illustrates an example of a procedure of manufacturing a single light emitting device.

Referring to FIGS. 15 and 16, a metal frame 90 is processed through a press process so that the first lead frame 21 and the second lead frame 31 can be formed. A plurality of holes 91 are formed in the metal frame 90, and the first lead frame 21 and the second lead frame 31 may be distinguished from each other by the holes 91. In the metal frame 90, two light emitting device regions A1 and A2 can be manufactured by one injection gate (not shown). In this case, since the two light emitting device regions A1 and A2 are injection-molded by injecting a liquid-phase material through one injection gate, adjacent lead frames 21 and 31 between the light emitting device regions A1 and A2 must be held by a hanger 51. FIG. 15-16 show cutting regions (or lines) L1,L2, In FIG. 15, element A0 represents light emitting device regions A1, A2.

The hanger 51 connected to the first lead frame 21 of the first light emitting device region Al is connected with the second lead frame 31 of the second light emitting device region A2. The second lead frame 31 of the first light emitting device region A1 and the first lead frame 21 of the second light emitting device region A2 are connected to the metal frame 20 by another hanger, respectively.

The lead frames 21 and 31 of the light emitting device regions A1 and A2 are separated from each other by a separation region 19A, and are connected to the hanger 51 and a connection frame 92. The injection gate may be disposed between regions of the light emitting devices A1 and A2 or disposed in a region close to the hanger 51.

Further, the hanger 51 may hold the metal frame 20 or mutually different lead frames. The hanger 51 may be connected to mutually different adjacent lead frames to support center regions of the lead frames.

Referring to FIG. 17, a body is formed on the first and second lead frames 21 and 31 by injection-molding the body by injecting a liquid-shape material equal to a material of the body through an injection gate. In this case, a body is manufactured to have a shape as illustrated in FIG. 1 according to a shape of an injection mold. Next, the light emitting chips 71 and 72 are mounted in the cavities 25 and 35, connected to each other by a wire, and molded by a molding member. Then, when the molded light emitting chips 71 and 72 are cut along cutting regions L1 and L2, individual light emitting devices may be manufactured.

A gate is arranged at a region between adjacent light emitting device regions so that a separate gate structure is not formed in the light emitting device regions A1 and A2. Accordingly, external impact applied to lead frames of the light emitting device regions A1 and A2 is minimized so that a central region of the light emitting device may be protected and a yield rate may be improved.

Figure 18:
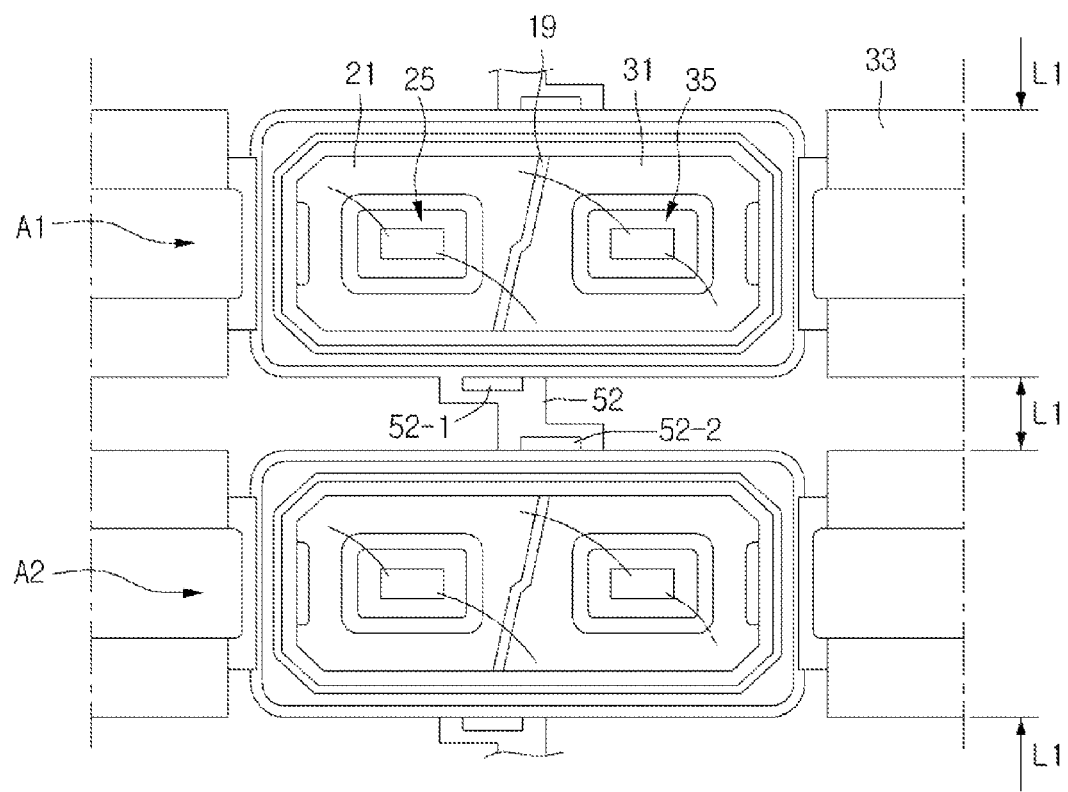
FIGS. 18 to 20 are views illustrating another example of a procedure of manufacturing the light emitting device according to the embodiment.

FIG. 18 is a view illustrating another example of a hanger according to the embodiment.

Referring to FIG. 18, the hanger 52 includes holes 52-1 and 52-2 close to the light emitting device regions A1 and A2, and may be connected to first and second lead frames 21 and 31 of the light emitting device regions A1 and A2, respectively. If the hanger 52 is cut along the cutting line L1, the light emitting device regions A1 and A2 may include first to fourth support protrusions formed at the first and second sidewalls, respectively, as illustrated in the second embodiment. That is, a plurality of support protrusions may be formed at each sidewall.

Figure 19:
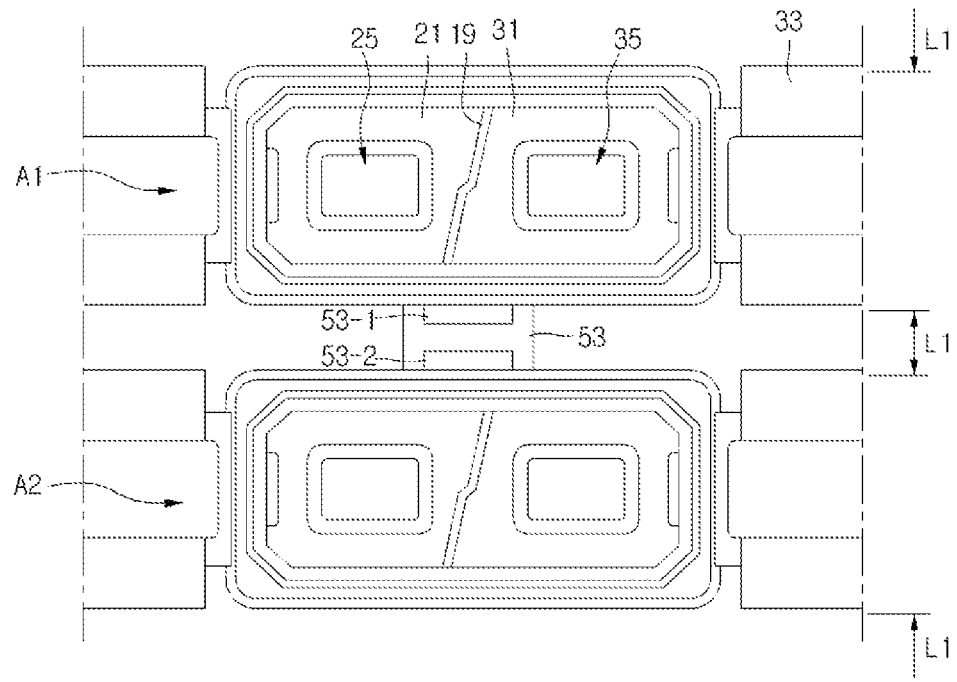

Referring to FIG. 19, a hanger 53 may include holes 53-1 and 53-2 corresponding to both sidewalls, and is connected to first and second lead frames 21 and 31 of the light emitting device regions A1 and A2, respectively. For example, the hanger 53 has an H shape. Accordingly, a plurality of support protrusions can be formed at each of the first and second sidewalls. FIG. 19 shows the second lead part 33.

Figure 20:
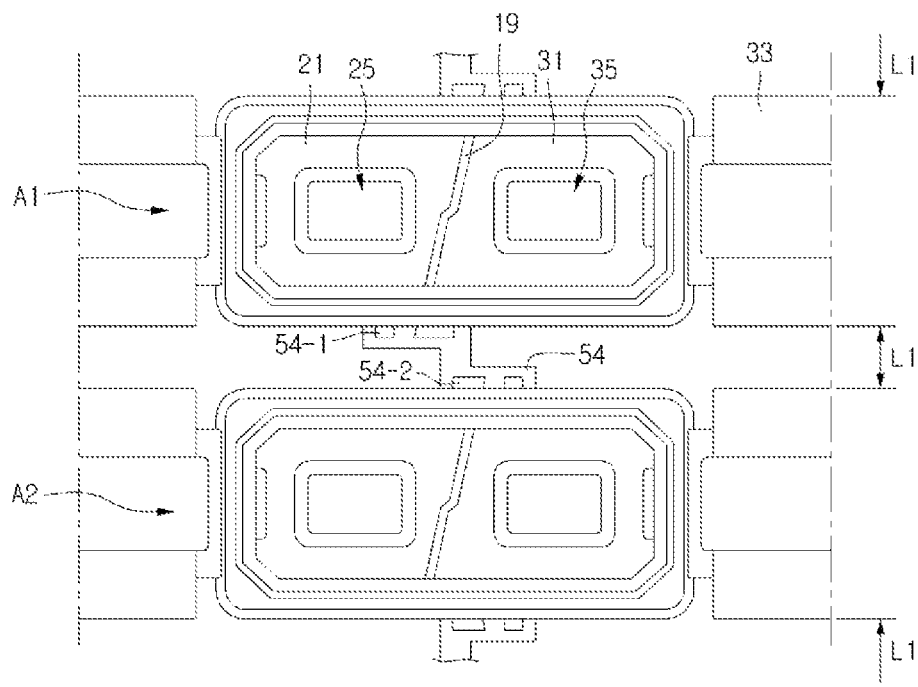
Figure 21:
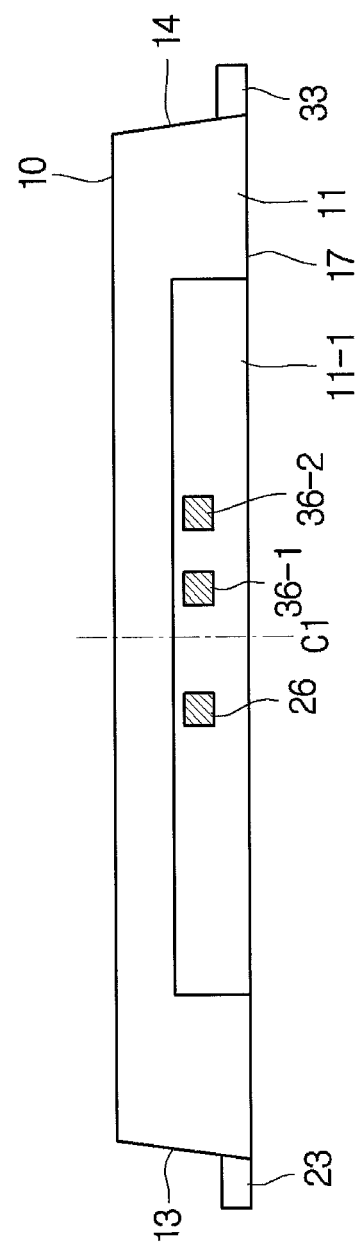
FIG. 21 is a view showing a first sidewall of the light emitting device manufactured by FIG. 20.
Figure 22:
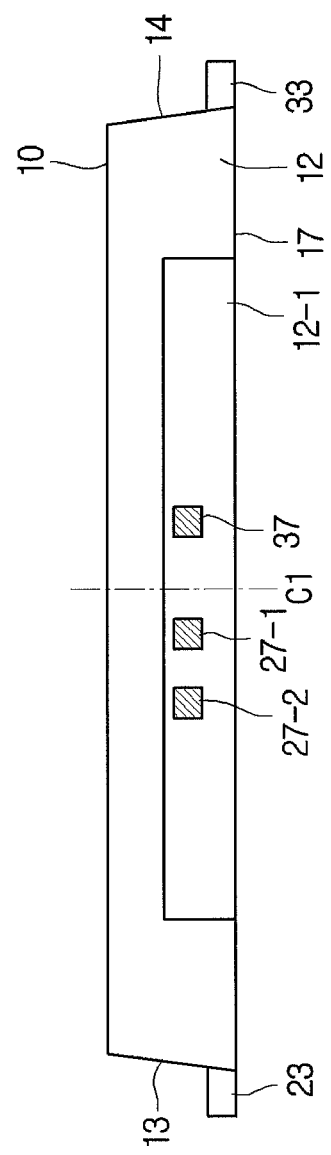
FIG. 22 is a view showing a second sidewall of the light emitting device of FIG. 20.

Referring to FIG. 20, a hanger 54 includes a plurality of holes 54-1 and 54-2 close to the light emitting device regions A1 and A2, and at least three support protrusions are formed in each lead frame 21 or 31 in a direction of the first or second sidewall. The at least three support protrusions are exposed to a first sidewall and a second sidewall of a body, two of the three support protrusions exposed to the first sidewall are connected to a second lead frame, and a remaining one support protrusion is connected to a first lead frame. Further, two of the three support protrusions exposed to the second sidewall are connected to the first lead frame, and a remaining one support protrusion is connected to the second lead frame. Accordingly, when the hanger 54 is cut along the cutting line L1, a plurality of support protrusions 26, 27-1, 27-2, 36-1, 36-2, and 37 protruding from the lead frames 21 and 31 may be disposed in the sidewalls 11 and 12 of the light emitting devices as illustrated in FIGS. 21 and 22. For example, a plurality of second support protrusions 27-1 and 27-2 protruding from the first lead frame 21 to the second sidewall 12 and a fourth support protrusion 37 of the second lead frame 31 are located at the same height from the bottom 17 of the body 10. A plurality of third support protrusions 36-1 and 36-2 protruding from the second lead frame 31 to the first sidewall 11 and a first support protrusion 26 of the first lead frame 21 are located at the same height from the bottom 17 of the body 10.

Further, an interval between the second support protrusions 27-1 and 27-2 may be narrower than an interval between the fourth support protrusion 37 and the second support protrusion 27-1 close to the fourth support protrusion 37. In addition, an interval between the third support protrusions 36-1 and 36-2 may be narrower than an interval between the first support protrusion 36 and the second support protrusion 27-1 close to the first support protrusion 26. FIG. 20 also shows the second lead part 33.

Referring to FIG. 21, the first support protrusion 26 of the first lead frame 21 disposed at the first sidewall 11 of the body 10 and a plurality of third support protrusions 36-1 and 36-2 of the second lead frame 31 are spaced apart from each other and may be disposed at the same height. The first support protrusion 26 and the third support protrusions 36-1 and 36-2 may be disposed inside a side 11-1 of a first outer peripheral portion which is a stepped region of the first sidewall 11. The first support protrusion 26 and the third support protrusions 36-1 and 36-2 may be exposed to a surface perpendicular to the bottom 17 of the body 10 in the first sidewall 11 or an inclined surface as illustrated in the first embodiment.

Referring to FIG. 22, a plurality of second support protrusions 36-1 and 36-2 of the first lead frame 21 disposed at the second sidewall 12 of the body 10 and the fourth support protrusion 37 of the second lead frame 31 are spaced apart from each other and may be disposed at the same height. The second support protrusions 27-1 and 27-2, and the fourth support protrusion 37 may be disposed at a side 12-1 of a second outer peripheral portion which is a stepped region of the second sidewall 12. The second support protrusions 27-1 and 27-2 and the fourth support protrusion 37 may be exposed to a surface perpendicular to the bottom 17 of the body 10 in the first sidewall 11 or an inclined surface as illustrated in the first embodiment.

FIGS. 23 to 30 are views illustrating another example of a hanger having a support protrusion according to the embodiment.

Figure 23:
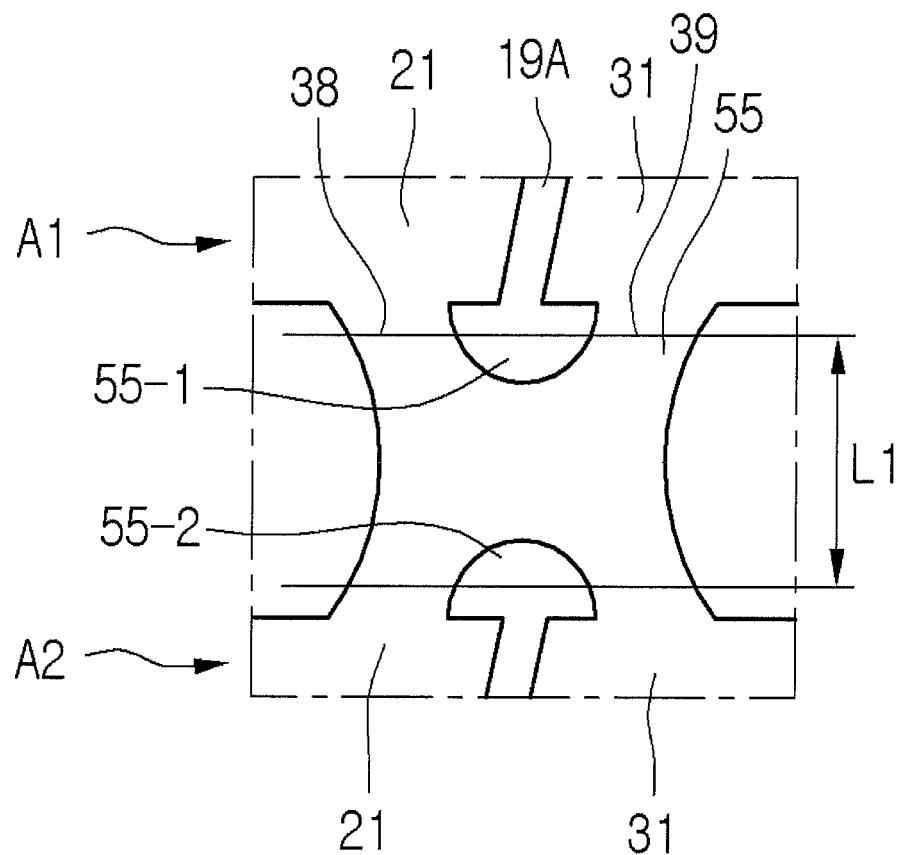
FIG. 23 is a view showing a first modified example of a support protrusion.
Figure 24:
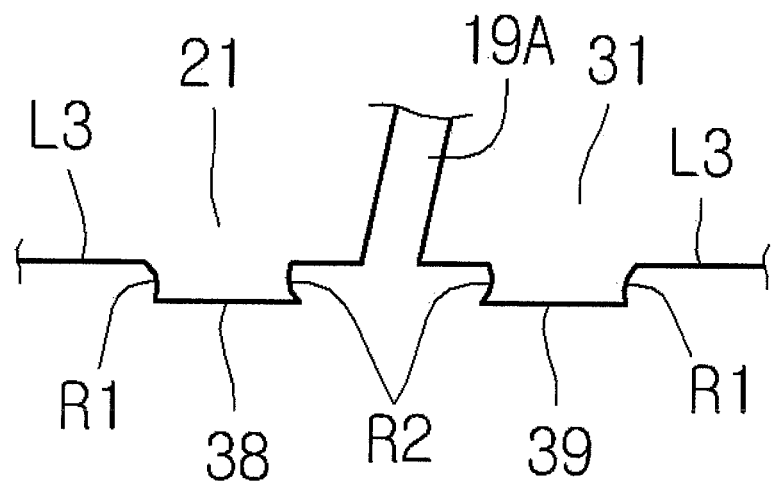
FIG. 24 is an enlarged view showing a support protrusion of the light emitting device manufactured by FIG. 23.

Referring to FIGS. 23 and 24, a hanger 55 is connected to the lead frames 21 and 31 in a cross shape. If the hanger 55 is cut along the cutting line L1, the first and second lead frames 21 and 31 include support protrusions 38 and 39 provided at one sidewall of a body 10, respectively. Lateral sides of the support protrusions 38 and 39 may have a curved surface with predetermined curvatures R3 and R4 with respect to an outer peripheral line L3 of the lead frames 21 and 31. The curved surface may have a convex or concave surface.

The hanger 55 includes holes 55-1 and 55-2 having a hemisphere shape between support protrusions so that cut support protrusions 38 and 39 have a curved shape.

Figure 25:
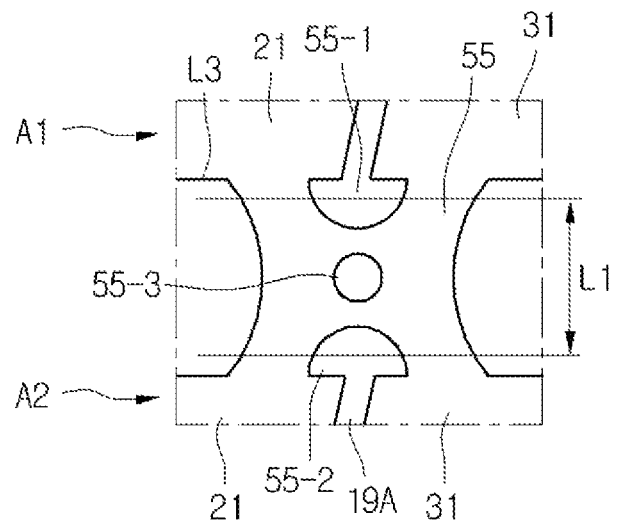
FIGS. 25 and 26 are views showing a second modified example of a support protrusion upon manufacture of the light emitting device according to the embodiment.

Referring to FIG. 25, a hanger 55 is connected to the lead frames 21 and 31 in a cross shape. A hole 55-3 corresponding to a gate may be formed at the central portion of the hanger 55.

Figure 26:
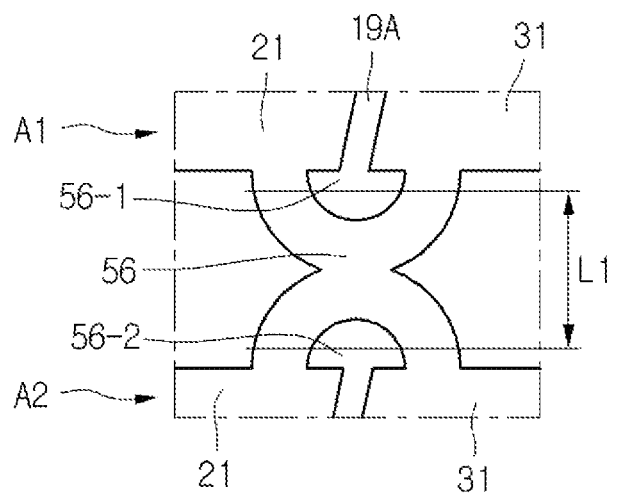
Figure 27:
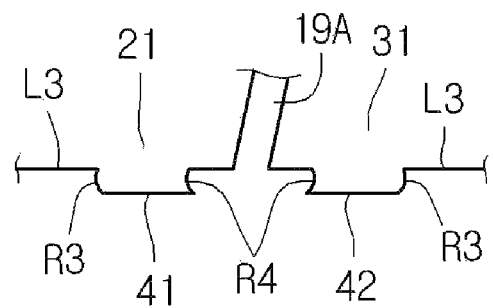
FIG. 27 is a view showing the support protrusion of the light emitting device by FIGS. 25 and 26.

Referring to FIGS. 26 and 27, a hanger 56 is connected to the lead frames 21 and 31 in a cross shape and includes holes 56-1 and 56-2 having a hemisphere shape. The hanger 56 is cut along a cutting line L1. Lateral sides of the support protrusions 41 and 42 may have a curved surface with predetermined curvatures R3 and R4 with respect to an outer peripheral line L3. The curved surface may have a convex or concave surface.

Figure 28:
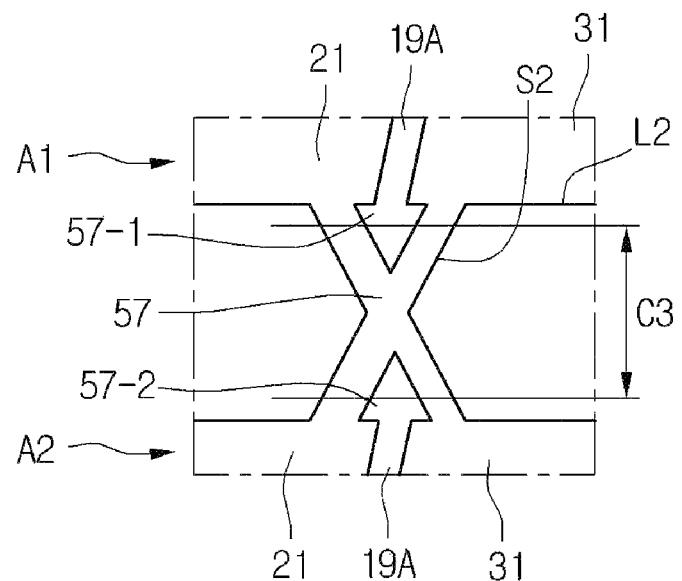
FIG. 28 is a view showing a third modified example of a support protrusion upon manufacture of the light emitting device according to the embodiment.
Figure 29:
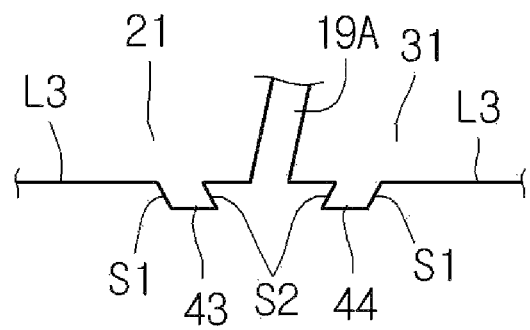
FIG. 29 is a view showing an example of the support protrusion of the light emitting device by FIG. 28.

Referring to FIGS. 28 and 29, a hanger 57 is connected to the lead frames 21 and 31 in a cross shape and includes holes 57-1 and 57-2 having a triangular shape. Since the hanger 57 is connected to the lead frames 21 and 31 of the light emitting device regions A1 and A2, if the hanger 57 is cut along a cutting line L1, the support protrusions 43 and 44 of the hanger 57 include inclined lateral sides S1 and S2 provided in the lead frames 21 and 31, respectively. In addition, the support protrusions 43 and 44 of the lead frames 21 and 31 have an oblique shape, respectively.

Figure 30:
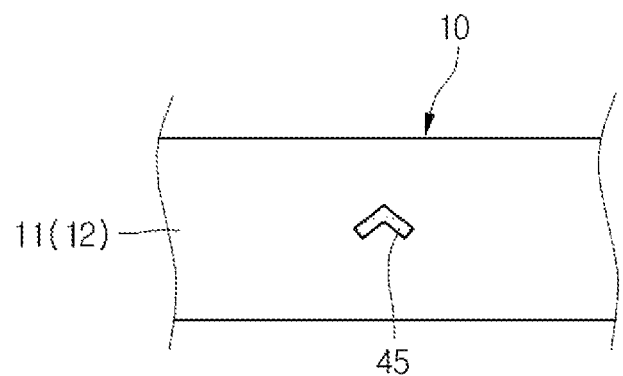
FIGS. 30 and 31 are views showing modified examples of the support protrusion of the light emitting device according to the embodiment, respectively.
Figure 31:
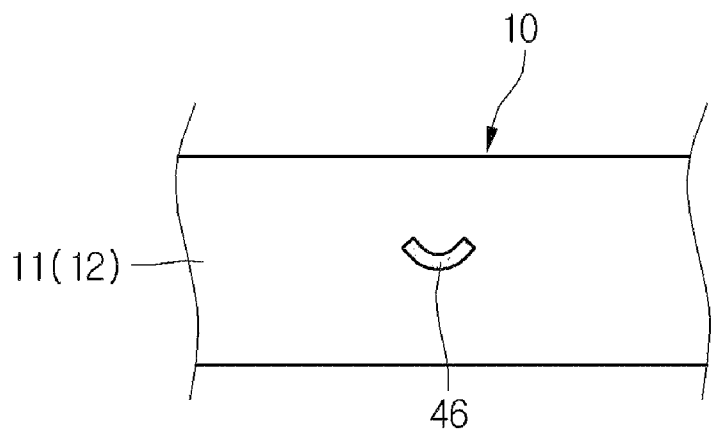

FIGS. 30 and 31 are views showing modified examples of the support protrusion of the light emitting device according to the embodiment.

As shown in FIG. 30, a support protrusion 45 of a lead frame disposed at each of the sidewalls 11 and 12 has a bent structure. The bent structure may be bent at least once rather than a line shape and may reinforce the stiffness of the support protrusion.

As shown in FIG. 31, the support protrusion 46 of the lead frame has a curved shape. The curved shape has a concave or convex shape and may reinforce the stiffness of the support protrusion.

<Lighting System>

The light emitting device according to the embodiment is applicable to a lighting system. The lighting system includes a structure in which a plurality of light emitting devices are arrayed. The lighting system includes a display apparatus shown in FIG. 32, and a lighting apparatus shown in FIG. 33, which can be used for a lighting lamp, a camera flash, a signal lamp, a headlamp for a vehicle, or an electronic display.

Figure 32:
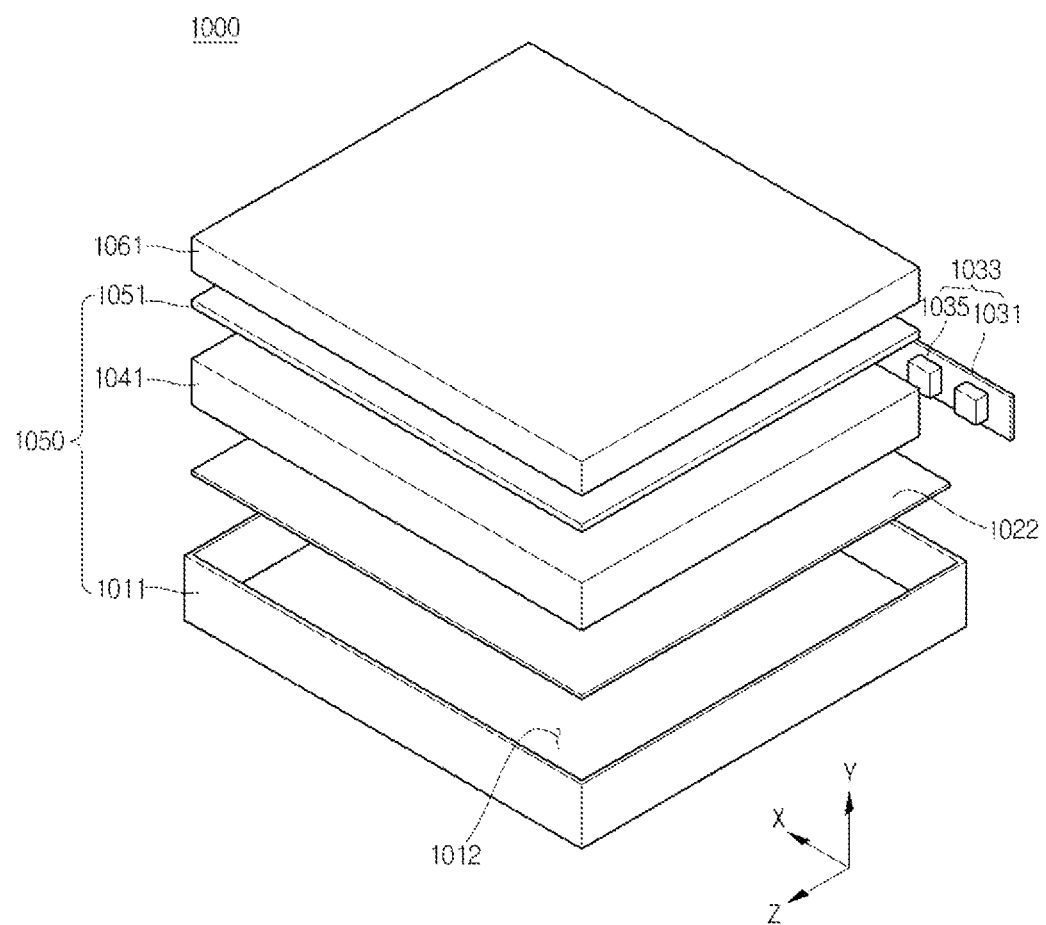
FIG. 32 is a perspective view showing a display apparatus having the light emitting device according to the embodiment.

FIG. 32 is an exploded perspective view showing a display apparatus having the light emitting device according to the embodiment.

Referring to FIG. 32, a display apparatus 1000 according to the embodiment includes a light guide plate 1041, a light source module 1033 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1033, and the reflective member 1022, but the embodiment is not limited thereto.

The bottom cover 1011, the reflective sheet 1022, the light guide plate 1041, the optical sheet 1051, and the light unit 1050 may be defined as a back light unit.

The light guide plate 1041 diffuses the light supplied from the light source module 1033 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphtha late) resin.

The light source module 1033 is disposed on at least one side of the light guide plate 1041 to supply the light to at least one side of the light guide plate 1041. The light source module 1033 serves as the light source of the display device.

At least one light source module 1033 is disposed to directly or indirectly supply the light from one side of the light guide plate 1041. The light source module 1033 may include a board 1031 and the light emitting device according to the embodiments or the light emitting device 1035. The light emitting device or the light emitting device 1035 are arranged on the board 1031 while being spaced apart from each other at the predetermined interval.

The board 1031 may include a printed circuit board (PCB) including a circuit pattern (not shown). In addition, the board 1031 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the board 1031 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the board 1031, but the embodiment is not limited thereto. The light emitting device 1035 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1033, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 103 as optical members, but the embodiment is not limited thereto.

Figure 33:
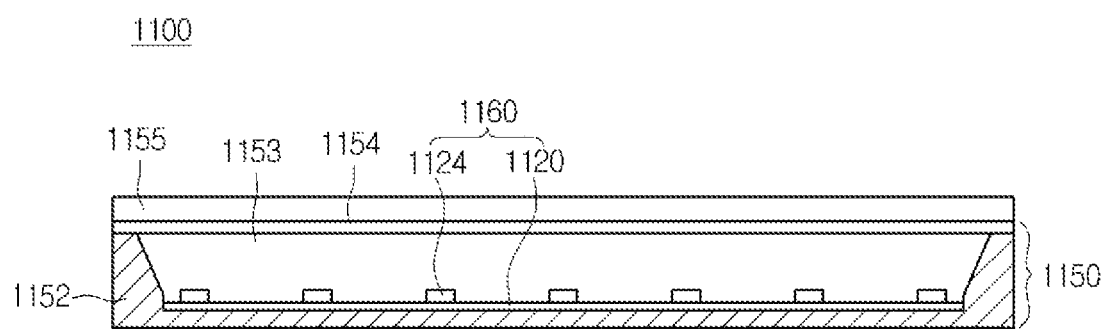
FIG. 33 is a sectional view showing a display apparatus according to the embodiment.

FIG. 33 is a sectional view showing a display apparatus according to the embodiment.

Referring to FIG. 33, the display device 1100 includes a bottom cover 1152, a board 1120 on which the light emitting device 1124 are arrayed, an optical member 1154, and a display panel 1155.

The board 1120 and the light emitting device 1124 may constitute the light source module 1160. In addition, the bottom cover 1152, at least one light source module 1160, and the optical member 1154 may constitute the light unit 1150. The bottom cover 1152 can be disposed with a receiving section 1153, but the embodiment is not limited thereto. The light source module 1160 includes a board 1120, and a plurality of light emitting devices arranged on the board 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 34:
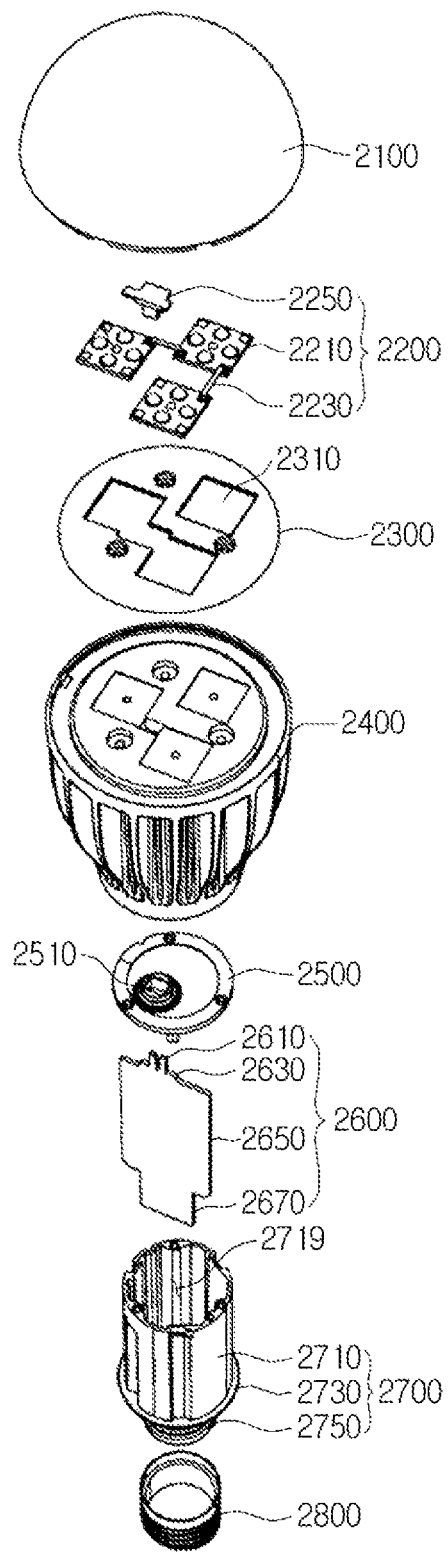
FIG. 34 is an exploded perspective view showing a lighting device having the light emitting device according to the embodiment.

FIG. 34 is an exploded perspective view showing a lighting device having the light emitting device according to the embodiment.

Referring to FIG. 34, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 2650. For example, the parts include a DC converter, a driving chip to drive the light source module 2220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

The embodiment can reduce impact applied to the central portion of the body of the light emitting device, thereby improving a yield rate of the light emitting device. The embodiment can improve the durability of the light emitting device, thereby improving a lighting system including the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body including first and second sidewalls having a first length and corresponding to each other, third and fourth sidewalls close to the first and second sidewalls and having a second length shorter than the first length, and a concave portion having an open upper portion;

a first lead frame disposed in the concave portion of the body and including a first cavity having a depth lower than a bottom of the concave portion;
a second lead frame disposed in the concave portion of the body and including a second cavity having a depth lower than the bottom of the concave portion;
a gap part between the first and second lead frames;
a first light emitting chip in the first cavity and on the first lead frame; and
a second light emitting chip in the second cavity and on the second lead frame,
wherein the first lead frame comprises a first lead part protruding to the third sidewall of the body, and a first single support protrusion in the first sidewall of the body, and
wherein the second lead frame comprises a second lead part protruding to the fourth sidewall of the body, and a second single support protrusion in the second sidewall of the body,
wherein a straight central line extends from the first sidewall, through a center of the gap part and to the second sidewall in a straight line, wherein the first light emitting chip on the first lead frame and the first single support protrusion are on a first side of the central line, and the second light emitting chip on the second lead frame and the second single support protrusion are on a second side of the central line, the second side being opposite to the first side, and the first single support protrusion and the second single support protrusion are asymmetrically located with respect to the straight center line that extends from the first sidewall having the first single support protrusion to the second sidewall having the second single support protrusion,
wherein the first single support protrusion has a thickness equal to a thickness of the first lead frame under the first light emitting chip, and
wherein the second single support protrusion has a thickness equal to a thickness of the second lead frame under the second light emitting chip.

2. The light emitting device of claim 1, wherein the first and second single support protrusions are disposed at a position higher than a bottom of the body and lower than an upper portion of the body.

3. The light emitting device of claim 1, wherein the first and second single support protrusions have a width narrower than widths of top surfaces of the first and second light emitting chips.

4. The light emitting device of claim 1, wherein the first sidewall and the second sidewall are inclined with respect to an axis perpendicular to a bottom of the body, and top surfaces and bottom surfaces of the first and second single support protrusions are coupled in the body.

5. The light emitting device of claim 1, wherein the first single support protrusion is disposed closer to the third sidewall of the body than to the fourth sidewall of the body, and the second single support protrusion is disposed closer to the fourth sidewall of the body than to the third sidewall of the body.

6. The light emitting device of claim 1, wherein the first length is at least three times longer than the second length, and bottom surfaces of the first and second cavity are disposed in an open region of a bottom surface of the body.

7. The light emitting device of claim 1, wherein the first and second single support protrusions have a width in a range of 50 μm to 500 μm.

8. A light emitting device comprising:
a body including a concave portion having an open upper portion;
a first lead frame disposed in the concave portion of the body and including a first cavity having a depth lower than a bottom of the concave portion;
a second lead frame disposed in the concave portion of the body and including a second cavity having a depth lower than the bottom of the concave portion;
a gap part between the first and second lead frames;
a first light emitting chip in the first cavity and on the first lead frame;
a second light emitting chip in the second cavity and on the second lead frame; and
a molding member in the first cavity and the second cavity,
wherein a body comprises first and second sidewalls having a first length and corresponding to each other, and third and fourth sidewalls close to the first and second sidewalls and having a second length shorter than the first length,
wherein the first lead frame comprises a first support part disposed on a bottom of the concave portion of the body, and a first single support protrusion in the first sidewall of the body,
wherein the second lead frame comprises a second support part disposed on a bottom of the concave portion of the body, and a second single support protrusion in the second sidewall of the body, and
wherein the first single support protrusion and the second single support protrusion are disposed at a position higher than bottom surfaces of the first and second light emitting chips based on a bottom of the body,
wherein a straight central line extends from the first sidewall, through a center of the gap part and to the second sidewall in a straight line, wherein the first light emitting chip on the first lead frame and the first single support protrusion are on a first side of the central line, and the second light emitting chip on the second lead frame and the second single support protrusion are on a second side of the central line, the second side being opposite to the first side, and the first single support protrusion and the second single support protrusion are asymmetrically located with respect to the straight center line that extends from the first sidewall having the first single support protrusion to the second sidewall having the second single support protrusion,
wherein the first single support protrusion has a thickness equal to a thickness of the first lead frame under the first light emitting chip, and
wherein the second single support protrusion has a thickness equal to a thickness of the second lead frame under the second light emitting chip.

9. The light emitting device of claim 8, wherein the first support part comprises a first extension portion extending in a direction of the first sidewall of the body and connected to the first single support protrusion, and
the second support part comprises a second extension portion extending in a direction of the second sidewall of the body and connected to the second single support protrusion.

10. The light emitting device of claim 8, wherein at least one of the first and second support protrusions has a width narrower than widths of top surfaces of the first and second light emitting chips.

11. The light emitting device of claim 8, wherein the first to fourth sidewalls are inclined with respect to a bottom of the body, and the first length is at least three times longer than the second length.

* * * * *